United States Patent
Rond et al.

(10) Patent No.: US 12,433,620 B2
(45) Date of Patent: Oct. 7, 2025

(54) LOCUS EMITTER SHOCK WAVE CATHETER DEVICES WITH INCREASED LONGEVITY AND HIGHER SONIC OUTPUT

(71) Applicant: Shockwave Medical, Inc., Santa Clara, CA (US)

(72) Inventors: Danielle Sheree Rond, Santa Clara, CA (US); Rainier Betelia, San Jose, CA (US); Todd Weston Jenkins, San Jose, CA (US); Nancy P. Nguyen, San Jose, CA (US); Jason B. Franco, Milpitas, CA (US)

(73) Assignee: Shockwave Medical, Inc., Santa Clara, CA (US)

( * ) Notice: Subject to any disclaimer, the term of this patent is extended or adjusted under 35 U.S.C. 154(b) by 0 days.

(21) Appl. No.: 18/586,299

(22) Filed: Feb. 23, 2024

(65) Prior Publication Data
US 2025/0268617 A1    Aug. 28, 2025

(51) Int. Cl.
*A61B 17/22*    (2006.01)
*A61B 17/00*    (2006.01)

(52) U.S. Cl.
CPC .. *A61B 17/22022* (2013.01); *A61B 17/00234* (2013.01); *A61B 2017/00172* (2013.01);
(Continued)

(58) Field of Classification Search
CPC ........ A61B 17/22022; A61B 17/00234; A61B 90/30; A61B 90/37; A61B 2017/00057; A61B 2017/00106; A61B 2017/00238; A61B 2017/00305; A61B 2017/22025; A61B 2017/22028; A61B 2017/22074; A61B 2090/309; A61B 2090/3735; A61B 2090/378
See application file for complete search history.

(56) References Cited

U.S. PATENT DOCUMENTS 2,916,647 A    12/1959    George
3,412,288 A    11/1968    Ostrander
(Continued)

FOREIGN PATENT DOCUMENTS

AU    2009313507 B2    11/2014
AU    2013284490 B2    5/2018
(Continued)

OTHER PUBLICATIONS

Unpublished U.S. Appl. No. 18/524,575 (Hasenberg et al.), filed Nov. 30, 2023, titled "Systems, Devices, and Methods for Generating Shock Waves in a Forward Direction."
(Continued)

*Primary Examiner* — Shaun L David
*Assistant Examiner* — Rachael L Geiger
(74) *Attorney, Agent, or Firm* — Morrison & Foerster LLP

(57) ABSTRACT

An exemplary shock wave catheter system comprises: a catheter body comprising a lumen; an emitter wire configured to generate shock waves, wherein one or more gaps are formed between two or more portions of the emitter wire along a length of the catheter body, each of the one or more gaps forming a locus emitter; a carrier wire configured to conduct electricity to the emitter wire; and one or more electrical joints configured to electrically couple and join the emitter wire and the carrier wire.

22 Claims, 10 Drawing Sheets

(52) U.S. Cl.
CPC .............. *A61B 2017/00181* (2013.01); *A61B 2017/00194* (2013.01); *A61B 2017/00292* (2013.01); *A61B 2017/00477* (2013.01); *A61B 2017/00526* (2013.01); *A61B 2017/00836* (2013.01); *A61B 2017/00946* (2013.01); *A61B 2017/22025* (2013.01)

(56) References Cited

U.S. PATENT DOCUMENTS

| | | |
|---|---|---|
| 3,413,976 A | 12/1968 | Roze |
| 3,524,101 A | 8/1970 | Barbini |
| 3,583,766 A | 6/1971 | Padberg |
| 3,785,382 A | 1/1974 | Schmidt-Kloiber et al. |
| 3,902,499 A | 9/1975 | Shene |
| 3,942,531 A | 3/1976 | Hoff et al. |
| 4,027,674 A | 6/1977 | Tessler et al. |
| 4,030,505 A | 6/1977 | Tessler |
| 4,445,509 A | 5/1984 | Auth |
| 4,662,126 A | 5/1987 | Malcolm |
| 4,662,375 A | 5/1987 | Hepp et al. |
| 4,671,254 A | 6/1987 | Fair |
| 4,685,458 A | 8/1987 | Leckrone |
| 4,741,405 A | 5/1988 | Moeny et al. |
| 4,809,682 A | 3/1989 | Forssmann et al. |
| 4,813,934 A | 3/1989 | Engelson et al. |
| 4,878,495 A | 11/1989 | Grayzei |
| 4,890,603 A | 1/1990 | Filler |
| 4,900,303 A | 2/1990 | Lemelson |
| 4,990,134 A | 2/1991 | Auth |
| 4,994,032 A | 2/1991 | Sugiyama et al. |
| 5,009,232 A | 4/1991 | Hassler et al. |
| 5,046,503 A | 9/1991 | Schneiderman |
| 5,057,103 A | 10/1991 | Davis |
| 5,057,106 A | 10/1991 | Kasevich et al. |
| 5,061,240 A | 10/1991 | Cherian |
| 5,078,717 A | 1/1992 | Parins et al. |
| 5,102,402 A | 4/1992 | Dror et al. |
| 5,103,804 A | 4/1992 | Abele et al. |
| 5,116,227 A | 5/1992 | Levy |
| 5,152,767 A | 10/1992 | Sypal et al. |
| 5,152,768 A | 10/1992 | Bhatta |
| 5,154,722 A | 10/1992 | Filip et al. |
| 5,176,675 A | 1/1993 | Watson et al. |
| 5,195,508 A | 3/1993 | Muller et al. |
| 5,245,988 A | 9/1993 | Einars et al. |
| 5,246,447 A | 9/1993 | Rosen et al. |
| 5,254,121 A | 10/1993 | Manevitz et al. |
| 5,281,231 A | 1/1994 | Rosen et al. |
| 5,295,958 A | 3/1994 | Shturman |
| 5,304,134 A | 4/1994 | Kraus et al. |
| 5,321,715 A | 6/1994 | Trost |
| 5,324,255 A | 6/1994 | Passafaro et al. |
| 5,336,234 A | 8/1994 | Vigil et al. |
| 5,362,309 A | 11/1994 | Carter |
| 5,364,393 A | 11/1994 | Auth et al. |
| 5,368,591 A | 11/1994 | Lennox et al. |
| 5,395,335 A | 3/1995 | Jang |
| 5,417,208 A | 5/1995 | Winkler |
| 5,425,735 A | 6/1995 | Rosen et al. |
| 5,454,809 A | 10/1995 | Janssen |
| 5,472,406 A | 12/1995 | de la Torre et al. |
| 5,582,578 A | 12/1996 | Zhong et al. |
| 5,584,843 A | 12/1996 | Wulfman et al. |
| 5,603,731 A | 2/1997 | Whitney |
| 5,609,606 A | 3/1997 | O'Boyle |
| 5,662,590 A | 9/1997 | de la Torre et al. |
| 5,709,676 A | 1/1998 | Alt |
| 5,846,218 A | 12/1998 | Brisken et al. |
| 5,891,089 A | 4/1999 | Katz et al. |
| 5,893,840 A | 4/1999 | Hull et al. |
| 5,931,805 A | 8/1999 | Brisken |
| 6,007,530 A | 12/1999 | Dornhofer et al. |
| 6,033,371 A | 3/2000 | Torre et al. |
| 6,056,722 A | 5/2000 | Jayaraman |
| 6,080,119 A | 6/2000 | Schwarze et al. |
| 6,083,232 A | 7/2000 | Cox |
| 6,090,104 A | 7/2000 | Webster et al. |
| 6,113,560 A | 9/2000 | Simnacher |
| 6,132,444 A | 10/2000 | Shturman et al. |
| 6,146,358 A | 11/2000 | Rowe |
| 6,186,963 B1 | 2/2001 | Schwarze et al. |
| 6,210,408 B1 | 4/2001 | Chandrasekaran et al. |
| 6,215,734 B1 | 4/2001 | Moeny et al. |
| 6,217,531 B1 | 4/2001 | Reitmajer |
| 6,267,747 B1 | 7/2001 | Samson et al. |
| 6,277,138 B1 | 8/2001 | Levinson et al. |
| 6,287,272 B1 | 9/2001 | Brisken et al. |
| 6,352,535 B1 | 3/2002 | Lewis et al. |
| 6,364,894 B1 | 4/2002 | Healy et al. |
| 6,367,203 B1 | 4/2002 | Graham et al. |
| 6,371,971 B1 | 4/2002 | Tsugita et al. |
| 6,398,792 B1 | 6/2002 | O'Connor |
| 6,406,486 B1 | 6/2002 | de la Torre et al. |
| 6,440,124 B1 | 8/2002 | Esch et al. |
| 6,494,890 B1 | 12/2002 | Shturman et al. |
| 6,514,203 B2 | 2/2003 | Bukshpan |
| 6,524,251 B2 | 2/2003 | Rabiner et al. |
| 6,589,253 B1 | 7/2003 | Cornish et al. |
| 6,607,003 B1 | 8/2003 | Wilson |
| 6,638,246 B1 | 10/2003 | Naimark et al. |
| 6,652,547 B2 | 11/2003 | Rabiner et al. |
| 6,666,834 B2 | 12/2003 | Restle et al. |
| 6,689,089 B1 | 2/2004 | Tiedtke et al. |
| 6,736,784 B1 | 5/2004 | Menne et al. |
| 6,740,081 B2 | 5/2004 | Hilal |
| 6,755,821 B1 | 6/2004 | Fry |
| 6,939,320 B2 | 9/2005 | Lennox |
| 6,989,009 B2 | 1/2006 | Lafontaine |
| 7,066,904 B2 | 6/2006 | Rosenthal et al. |
| 7,087,061 B2 | 8/2006 | Chernenko et al. |
| 7,241,295 B2 | 7/2007 | Maguire |
| 7,309,324 B2 | 12/2007 | Hayes et al. |
| 7,389,148 B1 | 6/2008 | Morgan |
| 7,505,812 B1 | 3/2009 | Eggers et al. |
| 7,569,032 B2 | 8/2009 | Naimark et al. |
| 7,850,685 B2 | 12/2010 | Kunis et al. |
| 7,853,332 B2 | 12/2010 | Olsen et al. |
| 7,873,404 B1 | 1/2011 | Patton |
| 7,951,111 B2 | 5/2011 | Drasler et al. |
| 8,162,859 B2 | 4/2012 | Schultheiss et al. |
| 8,177,801 B2 | 5/2012 | Kallok et al. |
| 8,353,923 B2 | 1/2013 | Shturman |
| 8,556,813 B2 | 10/2013 | Cioanta et al. |
| 8,574,247 B2 | 11/2013 | Adams et al. |
| 8,728,091 B2 | 5/2014 | Hakala et al. |
| 8,747,416 B2 | 6/2014 | Hakala et al. |
| 8,888,788 B2 | 11/2014 | Hakala et al. |
| 8,956,371 B2 | 2/2015 | Hawkins et al. |
| 8,956,374 B2 | 2/2015 | Hawkins et al. |
| 9,005,216 B2 | 4/2015 | Hakala et al. |
| 9,011,462 B2 | 4/2015 | Adams et al. |
| 9,011,463 B2 | 4/2015 | Adams et al. |
| 9,044,618 B2 | 6/2015 | Hawkins et al. |
| 9,044,619 B2 | 6/2015 | Hawkins et al. |
| 9,072,534 B2 | 7/2015 | Hakala et al. |
| 9,138,249 B2 | 9/2015 | Adams et al. |
| 9,198,825 B2 | 12/2015 | Katragadda et al. |
| 9,333,000 B2 | 5/2016 | Hakala et al. |
| 9,421,025 B2 | 8/2016 | Hawkins et al. |
| 9,433,428 B2 | 9/2016 | Hakala et al. |
| 9,522,012 B2 | 12/2016 | Adams |
| 9,642,673 B2 | 5/2017 | Adams et al. |
| 9,855,050 B2 | 1/2018 | Lorenzo et al. |
| 9,993,292 B2 | 6/2018 | Adams et al. |
| 10,039,561 B2 | 8/2018 | Adams et al. |
| 10,118,015 B2 | 11/2018 | De La Rama et al. |
| 10,149,690 B2 | 12/2018 | Hawkins et al. |
| 10,154,799 B2 | 12/2018 | Van Der Weide et al. |
| 10,159,505 B2 | 12/2018 | Hakala et al. |
| 10,206,698 B2 | 2/2019 | Hakala et al. |
| 10,517,620 B2 | 12/2019 | Adams |
| 10,517,621 B1 | 12/2019 | Adams |
| 10,555,744 B2 | 2/2020 | Nguyen et al. |
| 10,682,178 B2 | 6/2020 | Adams et al. |

(56) References Cited

U.S. PATENT DOCUMENTS

| | | |
|---|---|---|
| 10,702,293 B2 | 7/2020 | Hawkins et al. |
| 10,709,462 B2 | 7/2020 | Nguyen et al. |
| 10,959,743 B2 | 3/2021 | Adams et al. |
| 10,966,737 B2 | 4/2021 | Nguyen |
| 10,973,538 B2 | 4/2021 | Hakala et al. |
| 11,000,299 B2 | 5/2021 | Hawkins et al. |
| 11,020,135 B1* | 6/2021 | Hawkins ............ A61M 25/104 |
| 11,076,874 B2 | 8/2021 | Hakala et al. |
| 11,337,713 B2 | 5/2022 | Nguyen et al. |
| 11,432,834 B2 | 9/2022 | Adams |
| 11,478,261 B2 | 10/2022 | Nguyen |
| 11,534,187 B2 | 12/2022 | Bonutti |
| 11,596,423 B2 | 3/2023 | Nguyen et al. |
| 11,596,424 B2 | 3/2023 | Hakala et al. |
| 11,602,363 B2 | 3/2023 | Nguyen et al. |
| 11,622,780 B2 | 4/2023 | Nguyen et al. |
| 11,696,799 B2 | 7/2023 | Adams et al. |
| 11,771,449 B2 | 10/2023 | Adams et al. |
| 11,779,363 B2 | 10/2023 | Vo |
| 2001/0044596 A1 | 11/2001 | Jaafar |
| 2002/0045890 A1 | 4/2002 | Celliers et al. |
| 2002/0082553 A1 | 6/2002 | Duchamp |
| 2002/0177889 A1 | 11/2002 | Brisken et al. |
| 2003/0004434 A1 | 1/2003 | Greco et al. |
| 2003/0176873 A1 | 9/2003 | Chernenko et al. |
| 2003/0229370 A1 | 12/2003 | Miller |
| 2004/0006333 A1 | 1/2004 | Arnold et al. |
| 2004/0010249 A1 | 1/2004 | Truckai et al. |
| 2004/0044308 A1 | 3/2004 | Naimark et al. |
| 2004/0097963 A1 | 5/2004 | Seddon |
| 2004/0097996 A1 | 5/2004 | Rabiner et al. |
| 2004/0162508 A1 | 8/2004 | Uebelacker |
| 2004/0249401 A1 | 12/2004 | Rabiner et al. |
| 2004/0254570 A1 | 12/2004 | Hadjicostis et al. |
| 2005/0015953 A1 | 1/2005 | Keidar |
| 2005/0021013 A1 | 1/2005 | Visuri et al. |
| 2005/0059965 A1 | 3/2005 | Eberl et al. |
| 2005/0075662 A1 | 4/2005 | Pedersen et al. |
| 2005/0090888 A1 | 4/2005 | Hines et al. |
| 2005/0113722 A1 | 5/2005 | Schultheiss |
| 2005/0113822 A1 | 5/2005 | Fuimaono et al. |
| 2005/0171527 A1 | 8/2005 | Bhola |
| 2005/0228372 A1 | 10/2005 | Truckai et al. |
| 2005/0245866 A1 | 11/2005 | Azizi |
| 2005/0251131 A1 | 11/2005 | Lesh |
| 2006/0004286 A1 | 1/2006 | Chang et al. |
| 2006/0069424 A1 | 3/2006 | Acosta et al. |
| 2006/0074484 A1 | 4/2006 | Huber |
| 2006/0184076 A1 | 8/2006 | Gill et al. |
| 2006/0190022 A1 | 8/2006 | Beyar et al. |
| 2006/0221528 A1 | 10/2006 | Li et al. |
| 2007/0016112 A1 | 1/2007 | Schultheiss et al. |
| 2007/0088380 A1 | 4/2007 | Hirszowicz et al. |
| 2007/0129667 A1 | 6/2007 | Tiedtke et al. |
| 2007/0156129 A1 | 7/2007 | Kovalcheck |
| 2007/0239082 A1 | 10/2007 | Schultheiss et al. |
| 2007/0239253 A1 | 10/2007 | Jagger et al. |
| 2007/0244423 A1 | 10/2007 | Zumeris et al. |
| 2007/0250052 A1 | 10/2007 | Wham |
| 2007/0255270 A1 | 11/2007 | Carney |
| 2007/0282301 A1 | 12/2007 | Segalescu et al. |
| 2007/0299481 A1 | 12/2007 | Syed et al. |
| 2008/0097251 A1 | 4/2008 | Babaev |
| 2008/0188913 A1 | 8/2008 | Stone et al. |
| 2009/0041833 A1 | 2/2009 | Bettinger et al. |
| 2009/0227992 A1 | 9/2009 | Nir et al. |
| 2009/0230822 A1 | 9/2009 | Kushculey et al. |
| 2009/0247945 A1 | 10/2009 | Levit et al. |
| 2009/0254114 A1 | 10/2009 | Hirszowicz et al. |
| 2009/0299447 A1 | 12/2009 | Jensen et al. |
| 2010/0016862 A1 | 1/2010 | Hawkins et al. |
| 2010/0036294 A1 | 2/2010 | Mantell et al. |
| 2010/0094209 A1 | 4/2010 | Drasler et al. |
| 2010/0114020 A1 | 5/2010 | Hawkins et al. |
| 2010/0114065 A1 | 5/2010 | Hawkins et al. |
| 2010/0121322 A1 | 5/2010 | Swanson |
| 2010/0179424 A1 | 7/2010 | Warnking et al. |
| 2010/0286709 A1 | 11/2010 | Diamant et al. |
| 2010/0305565 A1 | 12/2010 | Truckai et al. |
| 2011/0034832 A1 | 2/2011 | Cioanta et al. |
| 2011/0118634 A1 | 5/2011 | Golan |
| 2011/0208185 A1 | 8/2011 | Diamant et al. |
| 2011/0257523 A1 | 10/2011 | Hastings et al. |
| 2011/0295227 A1 | 12/2011 | Hawkins et al. |
| 2012/0071889 A1 | 3/2012 | Mantell et al. |
| 2012/0095461 A1 | 4/2012 | Herscher et al. |
| 2012/0116289 A1 | 5/2012 | Hawkins et al. |
| 2012/0143177 A1 | 6/2012 | Avitall et al. |
| 2012/0157991 A1 | 6/2012 | Christian |
| 2012/0203255 A1 | 8/2012 | Hawkins et al. |
| 2012/0253358 A1 | 10/2012 | Golan et al. |
| 2013/0030431 A1 | 1/2013 | Adams |
| 2013/0041355 A1 | 2/2013 | Heeren et al. |
| 2013/0116714 A1 | 5/2013 | Adams et al. |
| 2013/0123694 A1 | 5/2013 | Subramaniyan et al. |
| 2013/0150874 A1 | 6/2013 | Kassab |
| 2013/0253622 A1 | 9/2013 | Hooven |
| 2014/0039513 A1 | 2/2014 | Hakala et al. |
| 2014/0046229 A1 | 2/2014 | Hawkins et al. |
| 2014/0214061 A1 | 7/2014 | Adams et al. |
| 2014/0257130 A1 | 9/2014 | Cao et al. |
| 2015/0320432 A1 | 11/2015 | Adams |
| 2016/0151081 A1 | 6/2016 | Adams et al. |
| 2016/0324534 A1 | 11/2016 | Hawkins et al. |
| 2017/0135709 A1 | 5/2017 | Nguyen et al. |
| 2017/0303946 A1 | 10/2017 | Ku et al. |
| 2017/0311965 A1 | 11/2017 | Adams |
| 2018/0116717 A1 | 5/2018 | Taff et al. |
| 2019/0150960 A1 | 5/2019 | Nguyen et al. |
| 2021/0085347 A1* | 3/2021 | Phan ................ A61B 17/22004 |
| 2021/0085383 A1 | 3/2021 | Vo et al. |
| 2021/0236778 A1 | 8/2021 | Kim et al. |
| 2021/0338258 A1 | 11/2021 | Hawkins et al. |
| 2022/0015785 A1 | 1/2022 | Hakala et al. |
| 2022/0125453 A1 | 4/2022 | Nguyen |
| 2022/0240958 A1 | 8/2022 | Nguyen et al. |
| 2022/0287731 A1 | 9/2022 | Tan et al. |
| 2022/0287732 A1 | 9/2022 | Anderson et al. |
| 2023/0043475 A1 | 2/2023 | Adams |
| 2023/0107690 A1* | 4/2023 | Nguyen ........... A61B 17/22012 606/7 |
| 2023/0111020 A1 | 4/2023 | Sweis et al. |
| 2023/0165598 A1 | 6/2023 | Nguyen et al. |
| 2023/0190316 A1 | 6/2023 | Nguyen |
| 2023/0293197 A1 | 9/2023 | Nguyen et al. |
| 2023/0310073 A1 | 10/2023 | Adams et al. |
| 2023/0329731 A1 | 10/2023 | Hakala et al. |
| 2023/0380849 A1 | 11/2023 | Adams et al. |

FOREIGN PATENT DOCUMENTS

| | | |
|---|---|---|
| CA | 2104414 A1 | 2/1995 |
| CN | 1204242 A | 1/1999 |
| CN | 1269708 A | 10/2000 |
| CN | 1942145 A | 4/2007 |
| CN | 101043914 A | 9/2007 |
| CN | 102057422 A | 5/2011 |
| CN | 102271748 A | 12/2011 |
| CN | 102355856 A | 2/2012 |
| CN | 102765785 A | 11/2012 |
| CN | 203564304 U | 4/2014 |
| DE | 3038445 A1 | 5/1982 |
| DE | 202006014285 U1 | 12/2006 |
| EP | 0442199 A2 | 8/1991 |
| EP | 0571306 A1 | 11/1993 |
| EP | 623360 A1 | 11/1994 |
| EP | 0647435 A1 | 4/1995 |
| EP | 2253884 A1 | 11/2010 |
| EP | 2362798 B1 | 4/2014 |
| JP | S62-099210 U | 6/1987 |
| JP | S62-275446 A | 11/1987 |
| JP | H03-63059 A | 3/1991 |
| JP | H06-125915 A | 5/1994 |
| JP | H07-47135 A | 2/1995 |

(56) References Cited

FOREIGN PATENT DOCUMENTS

| | | |
|---|---|---|
| JP | H08-89511 A | 4/1996 |
| JP | H10-99444 A | 4/1998 |
| JP | H10-314177 A | 12/1998 |
| JP | H10-513379 A | 12/1998 |
| JP | 2002538932 A | 11/2002 |
| JP | 2004081374 A | 3/2004 |
| JP | 2004357792 A | 12/2004 |
| JP | 2005501597 A | 1/2005 |
| JP | 2005095410 A | 4/2005 |
| JP | 2005515825 A | 6/2005 |
| JP | 2006516465 A | 7/2006 |
| JP | 2007289707 A | 11/2007 |
| JP | 2007532182 A | 11/2007 |
| JP | 2008506447 A | 3/2008 |
| JP | 2011513694 A | 4/2011 |
| JP | 2011520248 A | 7/2011 |
| JP | 2011524203 A | 9/2011 |
| JP | 2011528963 A | 12/2011 |
| JP | 2012505050 A | 3/2012 |
| JP | 2012508042 A | 4/2012 |
| JP | 2015525657 A | 9/2015 |
| JP | 2015528327 A | 9/2015 |
| JP | 6029828 B2 | 11/2016 |
| JP | 6081510 B2 | 2/2017 |
| WO | WO-1989011307 A1 | 11/1989 |
| WO | WO-1996024297 A1 | 8/1996 |
| WO | WO-1999000060 A1 | 1/1999 |
| WO | WO-1999002096 A1 | 1/1999 |
| WO | WO-2000056237 A2 | 9/2000 |
| WO | WO-2004069072 A2 | 8/2004 |
| WO | WO-2005099594 A1 | 10/2005 |
| WO | WO-2005102199 A1 | 11/2005 |
| WO | WO-2006006169 A2 | 1/2006 |
| WO | WO-2006127158 A2 | 11/2006 |
| WO | WO-2007088546 A2 | 8/2007 |
| WO | WO-2007149905 A2 | 12/2007 |
| WO | WO-2009121017 A1 | 10/2009 |
| WO | WO-2009126544 A1 | 10/2009 |
| WO | WO-2009136268 A1 | 11/2009 |
| WO | WO-2009152352 A2 | 12/2009 |
| WO | WO-2010014515 A2 | 2/2010 |
| WO | WO-2010054048 A2 | 9/2010 |
| WO | WO-2011006017 A1 | 1/2011 |
| WO | WO-2011094111 A2 | 8/2011 |
| WO | WO-2011143468 A2 | 11/2011 |
| WO | WO-2012025833 A2 | 3/2012 |
| WO | WO-2013059735 A1 | 4/2013 |
| WO | WO-2014025397 A1 | 2/2014 |
| WO | WO-2014025620 A1 | 2/2014 |
| WO | WO-2015017499 A1 | 2/2015 |
| WO | WO-2019099218 A1 | 5/2019 |

OTHER PUBLICATIONS

Unpublished U.S. Appl. No. 18/586,299 (Rond et al.), filed Feb. 23, 2024, titled "Locus Emitter Shock Wave Catheter Devices With Increased Longevity and Higher Sonic Output."
Unpublished U.S. Appl. No. 18/595,148 (Hasenberg et al.), filed Mar. 4, 2024, titled "Burst Mode Operation of Intravascular Lithotripsy (IVL)."
International Search Report and Written Opinion received for International Patent Application No. PCT/US2024/017293 mailed on Nov. 13, 2024, 11 pages.
International Search Report and Written Opinion received for International Patent Application No. PCT/US2024/032421 mailed on Feb. 20, 2025, 7 pages.
Final Office Action received for U.S. Appl. No. 18/680,370, mailed on Jan. 31, 2025, 14 pages.

\* cited by examiner

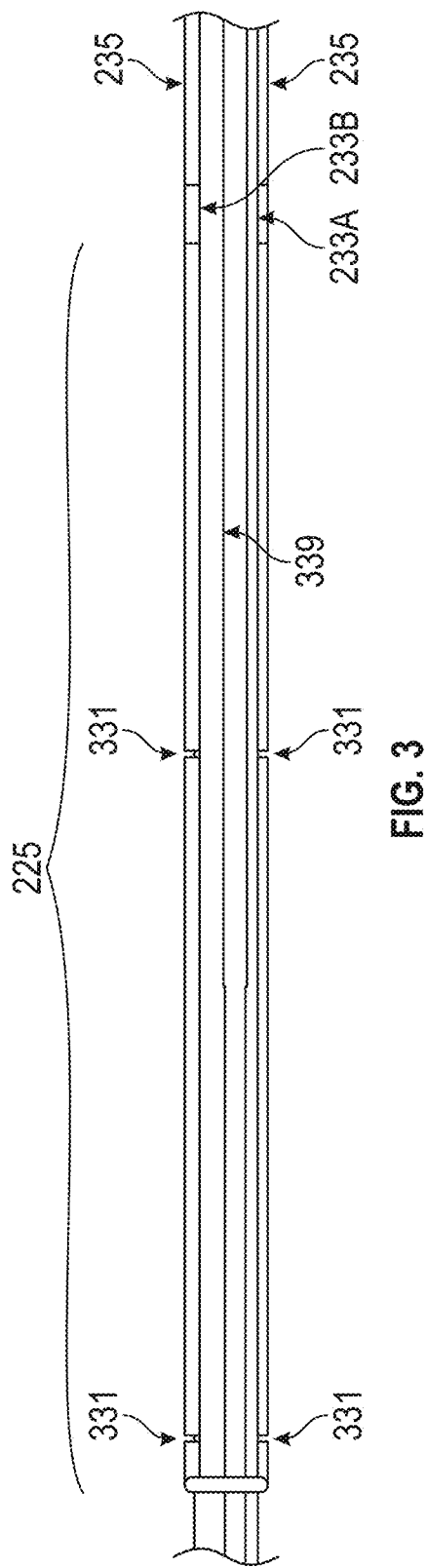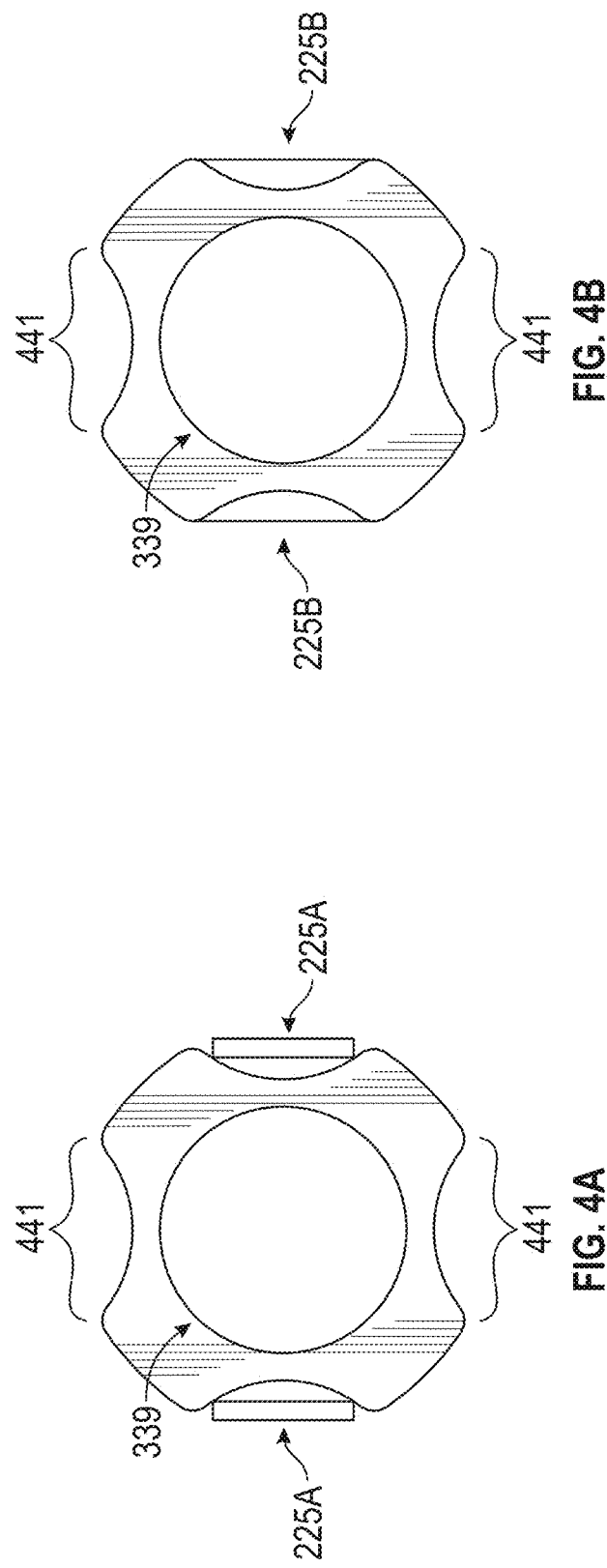

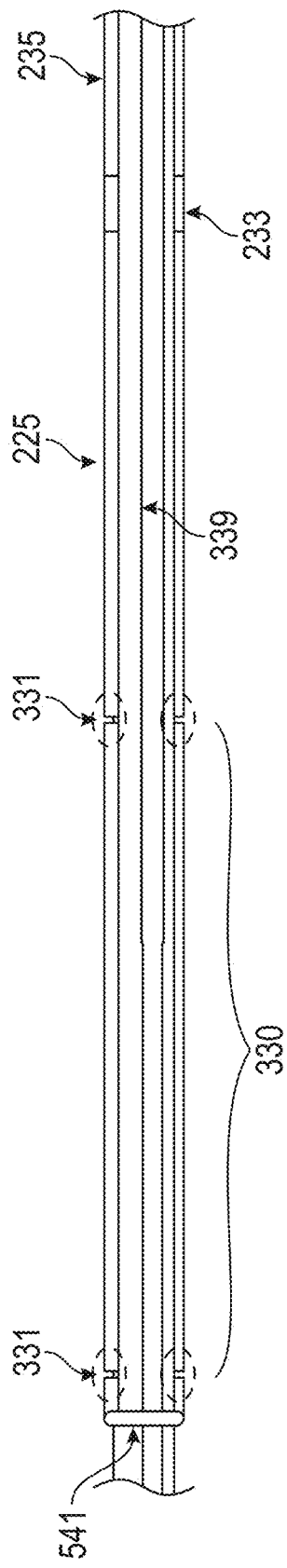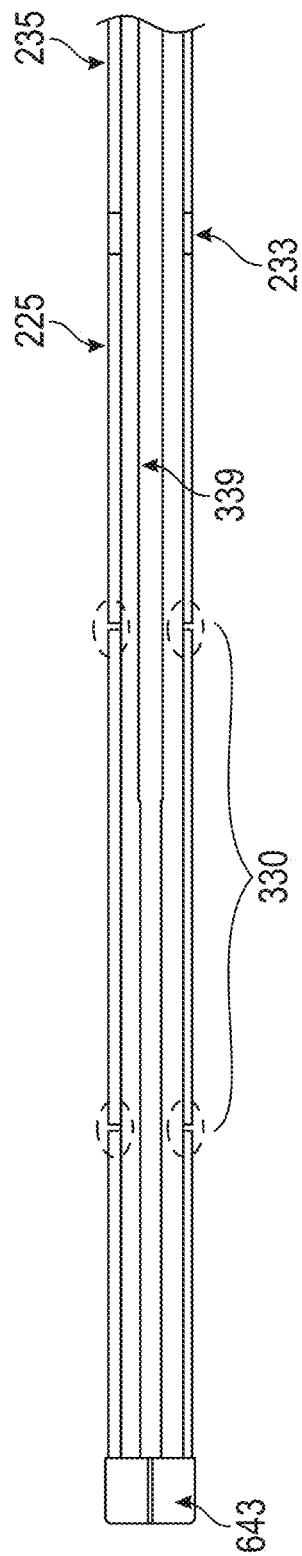

LOCUS EMITTER SHOCK WAVE CATHETER DEVICES WITH INCREASED LONGEVITY AND HIGHER SONIC OUTPUT

FIELD OF THE DISCLOSURE

The present disclosure relates generally to the field of medical devices and methods, and more specifically to shock wave catheter devices for treating calcified lesions in body lumens, such as calcified lesions and occlusions in vasculature and kidney stones in the urinary system.

BACKGROUND

A wide variety of catheters have been developed for treating calcified lesions, such as calcified lesions in vasculature associated with arterial disease. For example, treatment systems for percutaneous coronary angioplasty or peripheral angioplasty use angioplasty balloons to dilate a calcified lesion and restore normal blood flow in a vessel. In these types of procedures, a catheter carrying a balloon is advanced into the vasculature along a guide wire until the balloon is aligned with calcified plaques. The balloon is then pressurized (normally to greater than 10 atm), causing the balloon to expand in a vessel to push calcified plaques back into the vessel wall and dilate occluded regions of vasculature.

More recently, the technique and treatment of intravascular lithotripsy (IVL) has been developed, which is an interventional procedure to modify calcified plaque in diseased arteries. The mechanism of plaque modification is through use of a catheter having one or more acoustic shock wave generating sources located within a liquid that can generate acoustic shock waves that modify the calcified plaque. IVL devices vary in design with respect to the energy source used to generate the acoustic shock waves, with two exemplary energy sources being electrohydraulic generation and laser generation.

For electrohydraulic generation of acoustic shock waves, a conductive solution (e.g., saline) may be contained within an enclosure that surrounds electrodes or can be flushed through a tube that surrounds the electrodes. The calcified plaque modification is achieved by creating acoustic shock waves within the catheter by an electrical discharge across the electrodes. This discharge creates one or more rapidly expanding vapor bubbles that generate the acoustic shock waves. These shock waves propagate radially outward and modify calcified plaque within the blood vessels. For laser generation of acoustic shock waves, a laser pulse is transmitted into and absorbed by a fluid within the catheter. This absorption process rapidly heats and vaporizes the fluid, thereby generating the rapidly expanding vapor bubble, as well as the acoustic shock waves that propagate outward and modify the calcified plaque. The acoustic shock wave intensity is higher if a fluid is chosen that exhibits strong absorption at the laser wavelength that is employed. These examples of IVL devices are not intended to be a comprehensive list of potential energy sources to create IVL shock waves.

The IVL process may be considered different from standard atherectomy procedures in that it cracks calcium but does not liberate the cracked calcium from the tissue. Hence, generally speaking, IVL should not require aspiration nor embolic protection. Further, due to the compliance of a normal blood vessel and non-calcified plaque, the shock waves produced by IVL do not modify the normal vessel tissue or non-calcified plaque. Moreover, IVL does not carry the same degree of risk of perforation, dissection, or other damage to vasculature as atherectomy procedures or angioplasty procedures using cutting or scoring balloons.

More specifically, catheters to deliver IVL therapy have been developed that include pairs of electrodes for electrohydraulically generating shock waves inside an angioplasty balloon. Shock wave devices can be particularly effective for treating calcified plaque lesions because the acoustic pressure from the shock waves can crack and disrupt lesions near the angioplasty balloon without harming the surrounding tissue. In these devices, the catheter is advanced over a guide wire through a patient's vasculature until it is positioned proximal to and/or aligned with a calcified plaque lesion in a body lumen. The balloon is then inflated with conductive fluid (using a relatively low pressure of 2-4 atm) so that the balloon expands to contact the lesion, but is not an inflation pressure that substantively displaces the lesion. Voltage pulses can then be applied across the electrodes of the electrode pairs to produce acoustic shock waves that propagate through the walls of the angioplasty balloon and into the lesions. Once the lesions have been cracked by the acoustic shock waves, the balloon can be expanded further to increase the cross-sectional area of the lumen and improve blood flow through the lumen. Alternative devices to deliver IVL therapy can be within a closed volume other than an angioplasty balloon, such as a cap, balloons of various compliancies, or other enclosures.

The electrohydraulic shock wave emitters (e.g., pairs of electrodes for generating the shock waves) may have certain properties that can be improved. For example, the pairs of electrodes may comprise cylinders including an outer electrode surrounding an inner electrode with a sleeve located between. The crossing profile of the electrodes may be larger than desired, reducing deliverability of the catheter during treatment. Further, the cylinders may be rigid, also reducing deliverability. Additionally, the portion of the wire near or at the emitter bands may degrade or erode due to being subjected to high voltage pulsing (e.g., greater than 3 kV) and/or a large number of pulses for forming the shock waves. The degradation or erosion may reduce the longevity of the catheter and lower its sonic output. A flexible catheter with lower crossing profile, increased longevity, higher sonic output, or a combination thereof may be desirable.

SUMMARY

Described herein are systems and method for reducing the crossing profile, increasing the flexibility, increasing the longevity, and/or increasing the sonic output of a shock wave catheter system. A catheter may comprise a catheter body comprising one or more lumens, one or more conductive elements positioned along the catheter body, and one or more shock wave emitters formed by exposed portions of at least one of the one or more conductive elements separated by a spark gap. The shock wave emitters may be formed using a space between segments of a first conductive element (e.g., an emitter wire), which may be located at least partially within an enclosure (e.g., balloon) of the catheter. The shock wave emitters may be configured to generate shock waves when a sufficiently high voltage is applied across the gap separating segments of the emitter wire. The emitter wire may comprise a highly durable material that can be subjected to high voltage pulsing and/or a large number of pulses before degrading or eroding. In some examples, a second conductive element, referred to herein as a carrier wire, may be located in a channel of the catheter body (e.g., a conduit formed in an catheter body of the catheter in which the wire is positioned/secured) and may be configured to deliver current from a power supply to the shock wave emitters by conducting current to the emitter wire. One or more electrical joints may be configured to electrically couple and join the emitter wire and the carrier wire.

According to some aspects, an exemplary shock wave catheter system comprises: a catheter body comprising a lumen; an emitter wire configured to generate shock waves, wherein one or more gaps are formed between two or more portions of the emitter wire along a length of the catheter body, each of the one or more gaps forming a locus emitter; a carrier wire configured to conduct electricity to the emitter wire; and one or more electrical joints configured to electrically couple and join the emitter wire and the carrier wire. Optionally, the system comprises: an enclosure configured to be filled or inflated with a fluid, wherein the emitter wire is located at least partially within the enclosure. Optionally, the emitter wire is located along a distal end of the shock wave catheter system. Optionally, the emitter wire comprises molybdenum, tungsten, rhodium, rhenium, tantalum, niobium, or a combination thereof. Optionally, a diameter of the emitter wire comprises between 0.002" and 0.010". Optionally, the emitter wire is a flat wire or has a semi-circle profile. Optionally, the carrier wire is located along a proximal end of the shock wave catheter system. Optionally, the carrier wire comprises copper. Optionally, a diameter of the carrier wire is larger than a diameter of the emitter wire. Optionally, the one or more electrical joints are located near a distal end of the catheter body and proximally of the emitter wire. Optionally, the one or more electrical joints are formed using tack welding, laser welding, crimping, wrapping stripped wires around each other, soldering, swagging, a conductive adhesive, ferrule pins, or a combination thereof. Optionally, a number of the one or more locus emitters comprises between 1 and 16 locus emitters, including 1 and 16.

Optionally, the system comprises: a wire wrap or marker band located at a distal end of the shock wave catheter system. Optionally, the one or more locus emitters form emitter regions, wherein locus emitters of the same emitter region are positionally aligned along a length of the catheter body. Optionally, the one or more locus emitters comprise at least two locus emitters that are angularly aligned along a circumference of the catheter body. Optionally, the at least two locus emitters that are angularly aligned along a circumference of the lumen are spaced apart 180 degrees about the circumference of the catheter body.

Optionally, the system comprises: a protective layer located between the catheter body and the emitter wire. Optionally, the emitter wire comprises a first material, and the carrier wire comprises a second material different from the first material. Optionally, the first material comprises a high melting point, a higher electrical resistivity, a lower conductivity, a higher stiffness, a higher density, or any combination thereof, relative to the second material. Optionally, a diameter of the emitter wire is between 0.08 mm and 0.23 mm. Optionally, the carrier wire is located proximal of the emitter wire. Optionally, the system comprises: a protective layer positioned to at least partially enclose one or both of the emitter wire and the carrier wire, and wherein the protective layer secures one or both of the emitter wire and the carrier wire to the catheter body.

According to some aspects, a method for forming a shock wave catheter system comprises: laying down an emitter wire; securing the emitter wire to a distal end of a catheter body; cutting the emitter wire at one or more locations of one or more electrical joints; laying down a carrier wire; securing the carrier wire to a proximal end of the catheter body; and forming one or more electrical joints for electrically coupling and joining the emitter wire and the carrier wire. Optionally, the forming the one or more electrical joints comprises: clamping the emitter wire and the carrier wire; and using a laser to melt the emitter wire and the carrier wire together. Optionally, the forming the one or more electrical joints comprises: crimping a conductive cylinder or ferrule pin comprising copper, brass, silver, tin, stainless steel, or a combination thereof. Optionally, the forming the one or more electrical joints comprises: clamping the emitter wire and the carrier wire; passing current through the emitter wire, the carrier wire, or both to generate heat; and melting the emitter wire and the carrier wire together. Optionally, the emitter wire comprises molybdenum, and the carrier wire comprises copper.

According to some aspects, a shock wave catheter system comprises: a catheter comprising: a catheter body comprising a lumen; a conductive element configured to generate shockwaves, wherein the conductive element comprises one or more gaps along a length of the catheter body, each of the one or more gaps forming a shock wave emitter, wherein the conductive element comprises a molybdenum, tungsten, rhodium, rhenium, tantalum, niobium, or a combination thereof; and a power supply electrically coupled to the conductive element.

According to some aspects, a method for emitting shock waves in a body lumen comprises: positioning a distal portion of the catheter of claim 1 adjacent to a lesion in a blood vessel; and emitting one or more shock waves from the one or more locus emitters such that the one or more shock waves propagate toward the lesion and impact the lesion and exert a pressure of between 25 atm and 75 atm.

According to some aspects, a shock wave catheter system comprises: a catheter comprising: a catheter body comprising a lumen; an emitter wire configured to generate shock waves, wherein the emitter wire comprises one or more gaps in the emitter wire along a length of the lumen, each of the one or more gaps forming a shock wave emitter; a carrier wire configured to conduct electricity to the emitter wire; and one or more electrical joints configured to electrically couple and join the emitter wire and the carrier wire; and a power supply electrically coupled to the carrier wire.

Optionally, the catheter further comprises an enclosure configured to be filled or inflated with a fluid, and the emitter wire is located within the enclosure. Optionally, the emitter wire is located along a distal end of the catheter body. Optionally, the emitter wire comprises molybdenum, tungsten, rhodium, rhenium, tantalum, niobium, or a combination thereof. Optionally, a diameter of the emitter wire is greater than or equal to 0.08 mm and less than or equal to 0.23 mm. Optionally, the carrier wire is located proximal of the emitter wire. Optionally, the carrier wire comprises copper. Optionally, the carrier wire has a lower electrical resistivity than the emitter wire. Optionally, the emitter wire comprises a first metal and the carrier wire comprises a second metal different from the first metal. Optionally, the one or more shock wave emitters comprise at least two shock wave emitters that are angularly aligned along a circumference of the lumen.

DESCRIPTION OF THE FIGURES

Illustrative aspects of the present disclosure are described in detail below with reference to the following figures. It is

FIG. 3 illustrates a side view of an exemplary portion of a catheter that includes a plurality of locus emitters positioned along a catheter body that includes at least one lumen, according to some aspects.

FIG. 4A illustrates a cross-sectional view of an exemplary catheter including a catheter body, according to some embodiments.

FIG. 4B illustrates a cross-sectional view of an exemplary catheter including a catheter body, according to some embodiments.

FIG. 5 illustrates a side view of an exemplary catheter comprising a wire wrap, according to some aspects.

FIG. 6 illustrates a side view of an exemplary catheter comprising a marker band, according to some aspects.

DETAILED DESCRIPTION

The following description is presented to enable a person of ordinary skill in the art to make and use the various embodiments and aspects thereof disclosed herein. Descriptions of specific devices, assemblies, techniques, and applications are provided only as examples. Various modifications to the examples described herein will be readily apparent to those of ordinary skill in the art, and the general principles described herein may be applied to other examples and applications without departing from the spirit and scope of the various embodiments and aspects thereof. Thus, the various embodiments and aspects thereof are not intended to be limited to the examples described herein and shown but are to be accorded the scope consistent with the claims.

Figure 1A:
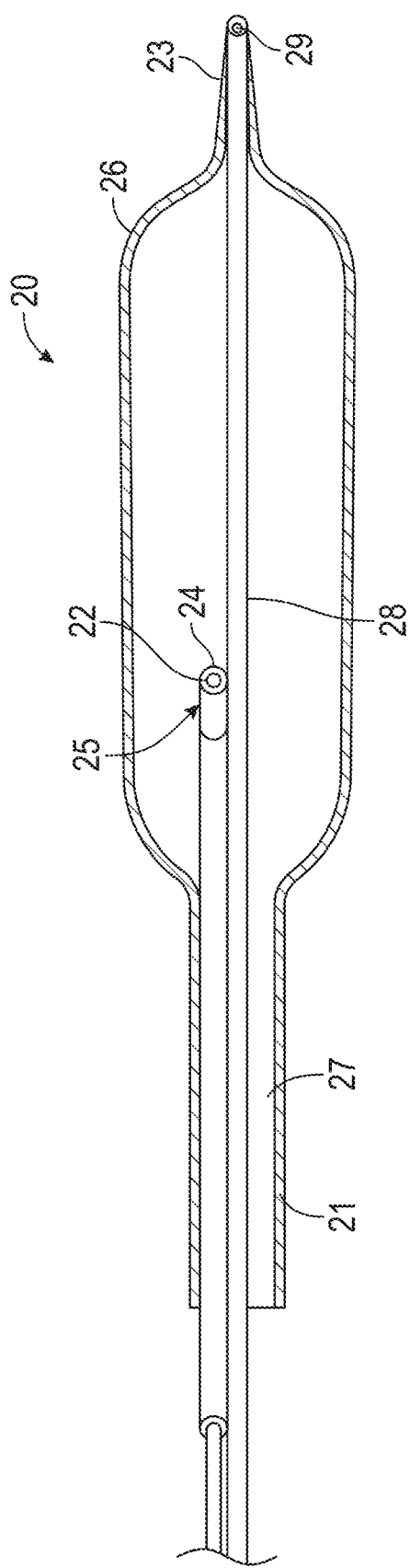
FIG. 1A illustrates a side view of an exemplary angioplasty balloon catheter according to some embodiments.

FIG. 1A illustrates a side view of an exemplary angioplasty balloon catheter. Catheter 20 includes an elongated carrier such as a hollow sheath 21, a dilating balloon 26 formed about a sheath 21 in sealed relation thereto, and a guide wire member 28 to which the balloon 26 is sealed at a seal 23. The guide wire member 28 may have a longitudinal lumen 29 through which a guide wire (not shown) may be received for directing the catheter 20 to a desired location within a vein or artery, for example.

The sheath 21 forms, with the guide wire member 28, a channel 27 through which fluid may be admitted into the balloon 26 to inflate the balloon 26. The balloon 26 may be filled with water, saline, a mixed saline solution, etc., allowing the balloon to be gently placed along the walls of the artery or vein, for example, in direct proximity with the calcified lesion. The fluid may also contain an x-ray contrast to permit fluoroscopic viewing of the catheter 20 during use. The channel 27 is in fluid communication with an electrode pair 25 and provides the conductive fluid necessary for shock wave generation. The electrode pair 25 may include electrodes 22 and 24 within the fluid-filled balloon 26.

Figure 1B:
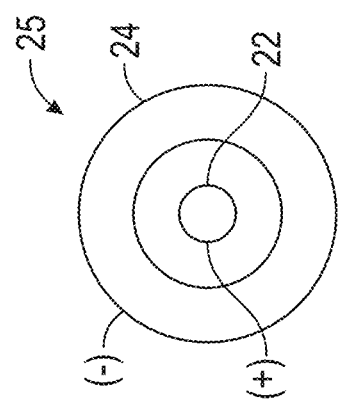
FIG. 1B illustrates an inner and outer electrode in the form of a cylinder according to some embodiments.

As may be seen in FIG. 1B, the electrodes 22 and 24 are coaxially disposed with electrode 22 being an inner electrode and electrode 24 being an outer electrode, in the form of a cylinder. The electrodes 22 and 24 may be formed of metal, such as stainless steel, or another conductive material. In some aspects, the outer electrode 24 surrounds the catheter 20 within the volume of the balloon 26, and the inner electrode 22 is in the interior of the catheter 20. In some aspects, the inner electrode 22 may be coupled to copper wires. The electrodes 22 and 24 may be spatially separated by a certain distance (gap) to allow a reproducible arc to form for a given applied voltage and current. The electrodes 22 and 24 may be spatially separated by an inner sleeve (e.g., an insulative sleeve).

As used herein, the term "electrode" refers to an electrically conducting element (typically made of metal) that receives electrical current and subsequently releases the electrical current to another electrically conducting element. In the context of the present disclosure, electrodes may be positioned relative to each other, such as in an arrangement of an inner electrode and an outer electrode, or in an arrangement of a proximal electrode and a distal electrode. Accordingly, as used herein, the term "electrode pair" refers to two electrodes that are positioned adjacent to and spaced apart from each other such that application of a sufficiently high voltage to the electrode pair will cause an electrical current to transmit across the gap (also referred to as a "spark gap") between the two electrodes (e.g., from an inner electrode to an outer electrode, or vice versa, optionally with the electricity passing through a conductive fluid or gas therebetween). In some contexts, one or more electrode pairs may also be referred to as an electrode assembly. In the context of the present disclosure, the term "emitter" broadly refers to the region of an electrode assembly where the current transmits across the electrode pair, generating a shock wave. The terms "emitter sheath" and "emitter band" refer to a continuous or discontinuous band of conductive material that may form one or more electrodes of one or more electrode pairs, thereby forming a location of one or more emitters.

Examples of the disclosure include a catheter that does not include at least one of: emitter bands (as used herein, locus emitter(s) may refer to emitters that do not include emitter bands), an inner sleeve, or an insulative sleeve. Instead of using a gap between cylindrical electrodes of an electrode pair, the spark gap of the locus emitter(s) described in this disclosure may use the space between segments of a conductive element that may be referred to herein as an emitter wire along the length of catheter body. Using the space between segments of the emitter wire inside the balloon (instead of the space between inner and outer electrodes of emitter bands) may also lead to a smoother surface, allowing the balloon to be fully inflated and wrapped tighter to the catheter body. In some examples, the number of components for the locus emitter(s) may be less (compared to shock wave emitters formed using emitter bands). As a result, the crossing profile, including the outer diameter of the locus emitters may be smaller. A smaller outer diameter of the locus emitters reduces the outer diameter of the catheter, making the catheter more tractable and more deliverable during treatment. In some examples, the reduced number of components for the locus emitter may also lead to easier manufacturing and lower costs. Additionally, or alternatively, a smaller outer diameter may allow the balloon to be pleated and/or folded due to fewer emitter components, which may further reduce the outer diameter of the catheter.

Figure 2:
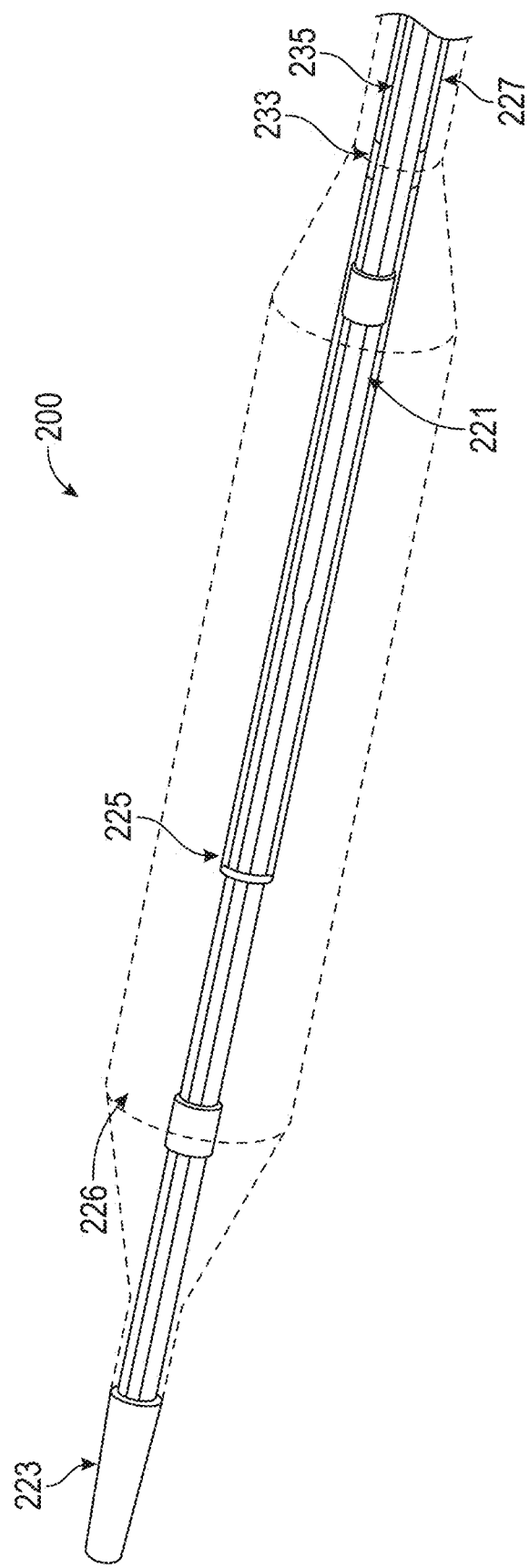
FIG. 2 illustrates a side view of an exemplary catheter including a plurality of locus emitters positioned within an enclosure, according to some examples.

FIG. 2 illustrates a side view of an exemplary catheter including a plurality of locus emitters positioned within an enclosure, according to some examples. Catheter 200 (part of a catheter system) includes an elongated carrier such as a catheter body 221, a dilating balloon 226 formed about the catheter body 221 in sealed relation thereto, and a guide wire member to which the balloon 226 is sealed at a seal 223. The guide wire member may have a longitudinal lumen through which a guide wire may be received for directing the catheter 200 to a desired location within a vein or artery, for example.

The catheter body 221 forms a channel 227 through which fluid may be admitted into the balloon 226 to inflate the balloon. The balloon 226 may be filled with water, saline, a mixed saline solution, etc., allowing the balloon to be gently placed along the walls of the artery or vein, for example, in direct proximity with the calcified lesion. The fluid may also contain an x-ray contrast to permit fluoroscopic viewing of the catheter 200 during use. The channel 227 is in fluid communication with one or more locus emitters and provides the conductive fluid necessary for shock wave generation.

The catheter 20 of FIG. 1 (discussed above) comprises a wire (not shown) located in the guide wire member 28. In some examples, the portion of the wire near or at the emitter bands may degrade or erode due to being subjected to high voltage pulsing (e.g., greater than 3 kV) and/or a large number of pulses for forming the shock waves. The degradation or erosion may reduce the longevity of the catheter and lower its sonic output.

Examples of the disclosure may comprise a wire that has slower degradation and/or lower erosion profiles. The catheter 200 comprises an emitter wire 225, a carrier wire 235, and one or more electrical joints 233. The emitter wire 225 runs within the fluid-filled balloon 226, and the carrier wire 235 runs along the proximal end of the catheter 200 at least partially within the channel 227. The carrier wire 235 may join with the emitter wire 225 using one or more electrical joints 233 near the distal end of the catheter 200, positioned proximally of the emitter wire between the emitter wire and carrier wire (e.g., joining the two wires). The locus emitter(s) may be formed by gaps in the emitter wire 225 (discussed in more detail below). The emitter wire 225 may comprise a material configured for shock wave generation, and the carrier wire 235 may comprise a material configured for conducting electricity, FIG. 3 illustrates a side view of an exemplary portion of a catheter that includes a plurality of locus emitters positioned along a catheter body that includes at least one lumen, according to some aspects. As shown in the figure, the emitter wire 225 includes a plurality of locus emitters 331. The locus emitters 331 include at least two electrodes formed from exposed portions/segments of emitter wire 225 separated by gaps, referred to herein as "spark gaps." The spacing between adjacent locus emitters 331 along the length of the lumen may be 2.0, 3.0, 4.5, 5.0, or 6.0 mm, as non-limiting examples. Examples of the disclosure may include any number of locus emitters 331, such as at least one (1), two (2), three (3), four (4), five (5), six (6), seven (7), eight (8), nine (9), ten (10), eleven (11), twelve (12), thirteen (13), fourteen (14), fifteen (15), and/or sixteen (16). The number of emitter regions and the spacing between locus emitters 331 can be customized and optimized for a given target catheter performance (e.g., increased sonic output, power draw, structural flexibility, specific or optional functionality for treatment, etc.).

The catheter 200 with locus emitters 331 may have greater flexibility at the distal end of the catheter 200 compared to catheters that use emitter bands (e.g., catheter 20 in FIG. 1). The emitter bands and related inner sleeves may comprise rigid cylinders that can add to points of stiffness to the distal end of the catheter 20. Replacing the rigid cylinders with the gaps in the emitter wire 225 may improve the flexibility of the catheter. An absence of material may result in increased bendability at the locations of the gaps (compared to if the material is present), thereby enhancing flexibility of the locus emitter catheter 200.

Example Emitter Wires

In some aspects, the emitter wire 225 may comprise a refractory material. Example refractory materials include, but are not limited to, molybdenum, tungsten, rhodium, rhenium, tantalum, niobium, clad wire, or a combination thereof. Molybdenum or tungsten (for the emitter wire 225) may have greater durability than other materials, e.g., copper. For example, molybdenum may have a higher melt temperature, allowing it to survive treatment for a longer period of time and degrade slower. The higher durability material allows the material of the emitter wire 225 to last longer due to less erosion when firing (passing current through) the locus emitters 331. Additionally, molybdenum or tungsten, for example, may lead to sustained output levels from the locus emitters 331 when fired longer, improving longevity of the emitter wire 225. In some embodiments, different combinations of the emitter wire 225 may further include copper, aluminum, gold, platinum, nickel, or the like, in order to take advantage of or blend the electrical and resistive characteristics of those metals along with the aforementioned refractory metals. The combination or composite of these metals can be a structure that has metals plated on top of each other (with or without insulative materials) or alloys of these metals.

The use of molybdenum or other refractory materials may be considered counterintuitive due to such refractory metals having a lower conductivity (impeding the performance of the generator providing the voltage for shock wave generation), higher stiffness/hardness (reducing deliverability of the catheter 200), and dissimilarities to other materials (making it difficult to form electrical joints for electrically coupling the materials). The durability and/or flexibility of the catheter may be enhanced by configuring the catheter to include a carrier wire 235 comprising a first material that has a relatively higher conductivity and/or lower stiffness (e.g., copper) along a portion of the catheter. Additionally, or alternatively, the catheter may comprise an emitter wire 225 comprising a second material that has higher durability than the first material. In some aspects, the emitter wire 225 may be located along a second portion of the catheter distally of the first portion. In some examples, the second material may comprise a stiffer and less conductive material (e.g., molybdenum). Use of the second material may advantageously result in longer-lasting electrodes, while use of the first, more conductive and/or more flexible, material along the first portion of the catheter may reduce or minimize any impact that use of a more durable material may have on overall conductivity and catheter stiffness. The emitter wire 225 and carrier wire 235 may be electrically coupled and joined together using one or more electrical joints, as described in detail throughout the disclosure.

The emitter wire 225 may comprise a round or flattened wire that has a smaller crossing profile than, e.g., the electrode pair 25 of FIG. 2. A smaller crossing profile may allow the catheter 200 to be used for accessing smaller vascular locations (e.g., coronary). In some examples, the emitter wire 225 may have a certain amount of insulation. For example, when a small crossing profile is desired, the catheter 200 may include a small amount of insulation. When high dielectric strength is desired, the catheter 200 may include a large amount of insulation. A higher dielectric strength can lead to better sonic output (e.g., higher magnitude and better longevity).

The size of the emitter wire 225 may be configured according to targeted profile and/or longevity. For example, a smaller diameter may result in a lower profile, but may decrease longevity. Example wire sizes for the emitter wire 225 include, but are not limited to, about 0.003", 0.004", 0.005", 0.008", 0.009", etc. in diameter. In some examples, the wire size for emitter wire 225 may be at least 0.003", at least 0.0034", at least 0.005", at least 0.006", at least 0.007", at least 0.008", at least 0.009", and/or at least 0.010". In some examples, the wire size for emitter wire 225 may be at most 0.010", at most 0.009", at most 0.008", at most 0.007", at most 0.006", at most 0.005", at most 0.004", at most 0.003", at most 0.002", and/or at most 0.001".

FIGS. 4A and 4B illustrate cross-sectional views of exemplary catheters including respective catheter bodies, according to some embodiments. The tube may include a lumen and emitter wire(s) positioned within channels of the elongate tube. In some examples, as shown in FIG. 4A, the emitter wire 225A may be a flat wire. Flat wires may enhance the flexibility of the wire (e.g., in at least one dimension), and as a result, the flexibility of the catheter body (e.g., catheter body 339 of FIG. 3) and distal end of the catheter 200. In such implementations, the sections of flat wire can be arranged on the distal section of a catheter to bend within the same plane, allowing for bending or curving of the distal section of the catheter in that plane of up to or greater than 180°. Flat wires may also decrease the crossing profile of the catheter 200.

In some examples, as shown in FIG. 4B, the emitter wire 225B may have a semi-circle profile with a convex side (e.g., the side of the emitter wire 225B closest to the catheter body 339) and a flat side (e.g., the side of the emitter wire 225B located further from the catheter body 339). The catheter body 339 may comprise a plurality of grooves 441, and the emitter wire 225B may be shaped such that the convex side is located within a groove 441. Configuring the emitter wire 225B such that it has a convex side may make it easier to manufacture compared to a flat emitter wire 225A having flat sides (shown in FIG. 4A). In some aspects, the emitter wire 225B may be configured with a flat side, resulting in a smaller crossing profile. In some examples, the emitter wire having a flat side may be configured such that the flat side is flush with an outer surface of the catheter body 339.

Example Carrier Wires 235

Returning to FIG. 2, the catheter 200 may include a carrier wire 235 configured to be located within the channel 227 of the catheter 200. The carrier wire 235 may deliver current to the locus emitters 331 for generating a shock wave. The carrier wire 235 may comprise a low resistance material suitable for transmitting electricity (voltage from a generator) to the distal end of the catheter 200 (to the emitter wire). The low resistance material may be copper, silver, gold, stainless steel, etc., as non-limiting examples.

When high current delivery is desired, the carrier wire 235 may be configured with a large size (e.g., the wire size may be selected based on the current to be delivered). In some aspects, the carrier wire 235 may have a larger wire size (diameter) than the emitter wire 225. The difference in wire sizes between the carrier wire 235 and the emitter wire 225 may allow for high current delivery while also increasing the flexibility of the catheter 200 (due to increased flexibility of the emitter wire 225 within the balloon 226). In some examples, the emitter wire 225 and the carrier wire 235 may have the same wire size.

Example Electrical Joints 233

In some instances, the emitter wire 225 and the carrier wire 235 may comprise dissimilar materials. For instance, the emitter wire 225 may comprise a material that is stiffer and/or has a higher resistivity (lower conductivity) (than the wire of catheter 20 of FIG. 1). The emitter wire 225 material may be more durable, less prone to erosion, which can lead to shrapnel formation during shock wave generation and, thus, pinholes in the balloon 226. For example, emitter wire 225 may include a material such as molybdenum. Although the emitter wire 225 may have increased longevity when formed from a more durable material (such as molybdenum, relative to when formed from a material such as copper), the higher durability may lead to overall lower conductivity and higher stiffness. To ensure or increase the voltage or current delivered to the locus emitters 331 for shock wave generation, examples of the disclosure may include a carrier wire 235 comprising a material having relatively higher conductivity. For example, the emitter wire 225 may be molybdenum or tungsten, and the carrier wire 235 may be copper. The emitter wire 225 and carrier wire 235 may be electrically coupled and joined by one or more electrical joints 233. The electrical joint(s) 233 may be located outside of the balloon 226, for example. In some aspects, the electrical joint 233 may be smooth and seamless (or near seamless) and/or located inside the balloon 226.

Figure 13:
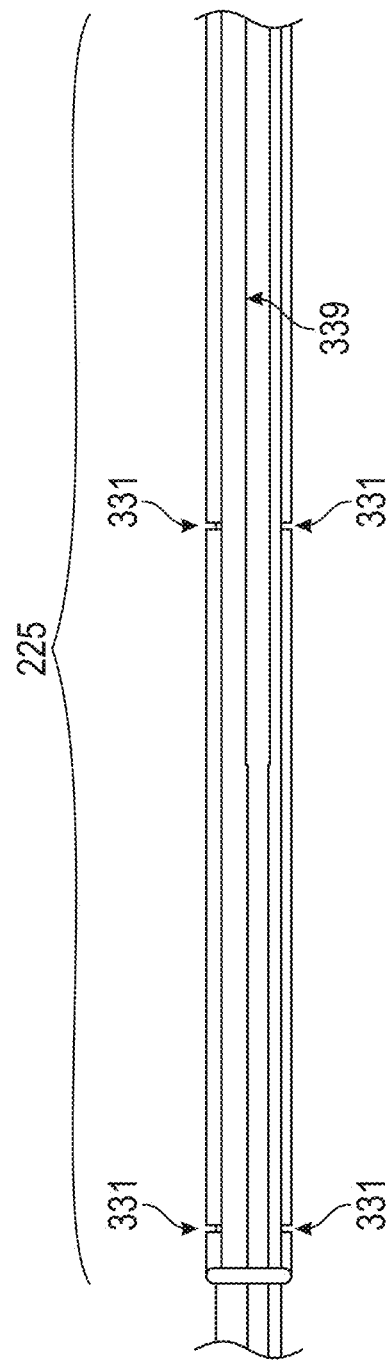
FIG. 13 illustrates a portion of an exemplary catheter that includes a plurality of locus emitters according to come examples.

The carrier wire 235 (e.g., copper) may be used for the majority (e.g., greater than 50%) of the length of the wire for the catheter 200, and the emitter wire 225 (e.g., molybdenum or tungsten) may be used at the distal end of the catheter 200. This reduces the stiffness of the catheter, making the catheter 200 more deliverable relative to an exemplary embodiment in which a wire formed from a more durable material such as molybdenum or tungsten is used along the length of the majority of the catheter (e.g., as shown in FIG. 13). This may also reduce the overall resistance of the catheter, reducing the amount of strain on the source generator that delivers the voltage or current to the locus emitter relative to if a material such as molybdenum or tungsten were used along the length of the majority of the catheter. In some examples, the catheter 200 may have increased longevity due using a stronger material for the emitter wire 225 that may reduce how fast the emitters erode; the catheter 200 may be used for a greater number of cycles. Additionally, or alternatively, the size of the catheter 200 may be smaller due to the smaller crossing profile and/or shorter lumen (as the spark gaps may be located closer to each other).

The dissimilarities between the emitter wire 225 and carrier wire 235 may make connecting the wires challenging. The emitter wire 225 and the carrier wire 235 may be electrically coupled using an electrical joint 233, using any methods including, but not limited to, tack welding, laser welding, crimping, wrapping stripped wires around each other, soldering, swagging, using a conductive adhesive, using ferrule pins, etc.

In some aspects, the electrical joint 233 may be formed using laser welding, which allows for a nice smooth transition (smaller changes in profile heights) between the emitter wire 225 and the carrier wire 235. Laser welding process may comprise using a clamping mechanism to hold multiple pieces (including the emitter wire 225 and the carrier wire 235), and using the heat from the laser to melt the pieces together. Crimping may comprise crimping a conductive cylinder or using a ferrule pin comprising copper, brass, silver, tin, stainless steel, etc., or a combination thereof. In some aspects, a plating material (e.g., nickel or chromium) may be used for rust prevention. In instances where soldering is used to form the electrical joint 233, a copper coating, nickel plating, nickel-chromium (e.g., 50% nickel, 50% chromium) plating, nickel-copper plating (e.g., 5% nickel, 95% copper), or the like, may be applied to the emitter wire 225 (including some portions such as the tip or the entirety of the emitter wire 225), as non-limiting examples. When using a conductive adhesive, example materials include, but are not limited to, silver, carbon graphite, gold, diamond, copper, aluminum, etc. A combination of the above-discussed techniques may be used, such as disposing solder underneath a crimping structure via flux, applying a conductive adhesive prior to swaging or crimping, etc.

The parameters of the method used for forming the electrical joint 233 may be determined based on durability and/or longevity. For example, the electrical joint 233 may not make complete electrical contact, or the crimp may weaken over time. In some aspects, the type of flux and flux cleaning methods for soldering; the time and temperature for resistance welding; and the laser power, focal length, and time for laser welding may be adjusted based on target durability and/or longevity.

Another example method is resistance welding, where multiple flattened pieces of materials are clamped together tightly using a certain pressure controlled by, e.g., an air actuator. The materials (the emitter wire 225, the carrier wire 325, or both) need to have some resistance to allow current to pass through for generating heat for the resistance welding, and need to have low conductivity to ensure that there is enough heat to melt the pieces together. In some aspects, the melting temperature of the two welded pieces of material may not be dissimilar. For example, molybdenum and copper have melting temperatures between about 2,000-4,700 degrees. In some examples, the resistance welding may be performed in an oxygen-free environment. An inert gas such as argon, nitrogen, or carbon dioxide may be used to reduce the amount of oxygen in the environment, which would prevent or reduce oxidation of the pieces during welding.

In some aspects, the catheter 200 may comprise a plurality of electrical joints 233. For example, a first electrical joint 233A (shown in FIG. 3) allows an electrical signal from the carrier wire 235 to the emitter wire 225 (proximal end to distal end of the catheter 200) for forming spark gaps. A second electrical joint 223B (shown in FIG. 3) allows an electrical signal from the emitter wire 225 to the carrier wire 235 (distal end to proximal end of the catheter 200). The first electrical joint 233A may be located at the same location along the length of the catheter body 339 as the second electrical joint 233B (as shown in the figure). In some aspects, the first electrical joint 233A and the second electrical joint 223B may be staggered (located at different locations along the length of the catheter body) (not shown). Staggering the joints may reduce the risk of an electrical short.

Example Formation of the Wires

To form the wires and electrical joint(s), the emitter wire 225 and the carrier wire 235 may be disposed on a catheter body 339. The catheter body 339 can be cylindrical and/or may have grooves 441 (as shown in FIGS. 4A and 4B). In some examples, the catheter body 339 may allow the emitter wire 225 and the carrier wire 235 to slide inside it.

As part of forming the catheter 200, the emitter wire 225 may be laid down and secured to the catheter body 339. The wires can be cut before or after being laid down, placing the wire gaps at or near the location of the electrical joint 233). The wires can be cut in such a way as to not damage the catheter body 339 during the manufacturing process. In some examples, forming the catheter 200 further comprises laying down the carrier wire 235, securing to the catheter body 339, and cutting it.

The wire (e.g., emitter wire 225 or carrier wire 235) may be located, at least in part, within some (including all) of the grooves 441 (FIG. 4A) of the catheter body 339. In some aspects, the wire may be secured to the catheter body 339 using, e.g., a top coat material. The top coat material may be an adhesive that secures the emitter wire 225 and/or the carrier wire 235 to one or more surfaces of the catheter body 339. The top coat material can be an adhesive or a plastic material. For example, after securing the emitter wire 225 or carrier wire 235 to the catheter body 339, the wire is adhered to the catheter body 339. In some aspects, the catheter body 339 may be formed by adhering an outer layer to an inner layer by means of mechanical, thermal, and/or lasers. A wire (e.g., emitter wire 225) may be laid on the inner layer. The outer layer may surround the wire and inner layer, and then the outer layer may be attached to form a cohesive catheter body. The outer layer may be the top coat material or a polyether block amide (peba) sleeve, for example. The top coat material may comprise a thermal plastic (e.g., polyolefin) that covers the emitter wire 225 and the electrical joint(s) 233 (to minimize shorting across exposed emitter wire 225), and attaches at least a part of the emitter wire 225 or carrier wire 235 to the lumen 339. In some embodiments, one or more wires (e.g., emitter wire 225) are secured to the inner lumen without a top coat material. For example, the wire may be affixed or adhered to the inner lumen by mechanical, thermal, or laser means.

Portions of the top coat material and/or emitter wire 225 may be removed at the gaps of the locus emitters 331. In some aspects, portions of the emitter wire 225 may be removed by, e.g., cutting the material of the emitter wire 225, for the gaps of the locus emitters 331. In some aspects, the emitter wire 225 may be partially cut at the gaps such that it is capable of creating a spark gap, but not damaging the lumen 339. In some aspects, the top coat material at the gaps may be removed. In some examples, the flexibility of the lumen 339 may also be enhanced due to the gaps in the emitter wire 225.

Example Configurations

Examples of the disclosure may include different configurations for the locus emitter catheters. In some examples, the catheter 200 comprises a wire wrap. FIG. 5 illustrates a side view of an exemplary catheter comprising a wire wrap, according to some aspects. The catheter body 339 comprises a proximal end and a distal end. Near or at the distal end of the catheter body 339, the emitter wire 225 is electrically coupled to the carrier wire 235 via one or more electrical joints 233. In some examples, the distal end of the catheter body 339 may be located closer to the electrical joint 233 than the proximal end. It should be understood that the figures used to illustrate the exemplary catheters herein may only depict a portion of the catheter and are not shown to scale. Accordingly, while the figures may depict electrical joints near a proximal end of a portion of a catheter, it should be understood that the catheter may extend far beyond what is shown in the illustrative figures. The electrical joints may be positioned closer to the distal end of the catheter than they are to the proximal end of the catheter. Near or at the distal end of catheter body 339, the emitter wire 225 may be routed by a wire wrap 541 that wraps around the lumen 339. As shown in the figure, the catheter 200 may include four locus emitters 331, but examples of the disclosure can include any number (not limited to four). Adjacent locus emitters 331 may be separated by a distance 330. As a non-limiting example, the distance 330 may be 6 mm. The distance between adjacent emitters (e.g., 330) may be at least 2 mm, at least 3 mm, at least 4 mm, at least 5 mm, at least 6 mm, at least 7 mm, at least 8 mm, at least 9 mm, at least 10 mm, at least 11 mm, at least 12 mm, at least 13 mm, at least 14 mm, at least 15 mm, at least 16 mm, at least 17 mm, at least 18 mm, at least 19 mm, and/or at least 20 mm. The distance between adjacent emitters (e.g., 330) may be at most 2 mm, at most 3 mm, at most 4 mm, at most 5 mm, at most 6 mm, at most 7 mm, at most 8 mm, at most 9 mm, at most 10 mm, at most 11 mm, at most 12 mm, at most 13 mm, at most 14 mm, at most 15 mm, at most 16 mm, at most 17 mm, at most 18 mm, at most 19 mm, and/or at most 20 mm. The distance between adjacent emitters (e.g., 330) may be between 2 mm and 20 mm.

In some examples, the catheter comprises a marker band 643, as shown in FIG. 6. The marker band 643 may be located at the distal end of the catheter 200. In some examples, the catheter comprises an additional marker band (not shown) positioned proximally of marker band 643. In some examples, the additional marker band may be positioned at or near a proximal end of the catheter. The marker band 643 may be used in place of the wire wrap 541 to electrically couple a first portion of emitter wire 225 to a second portion of emitter wire 225 such that a current can flow from a supply side of the carrier wire 235 to a return side of the carrier wire 235.

Figure 7:
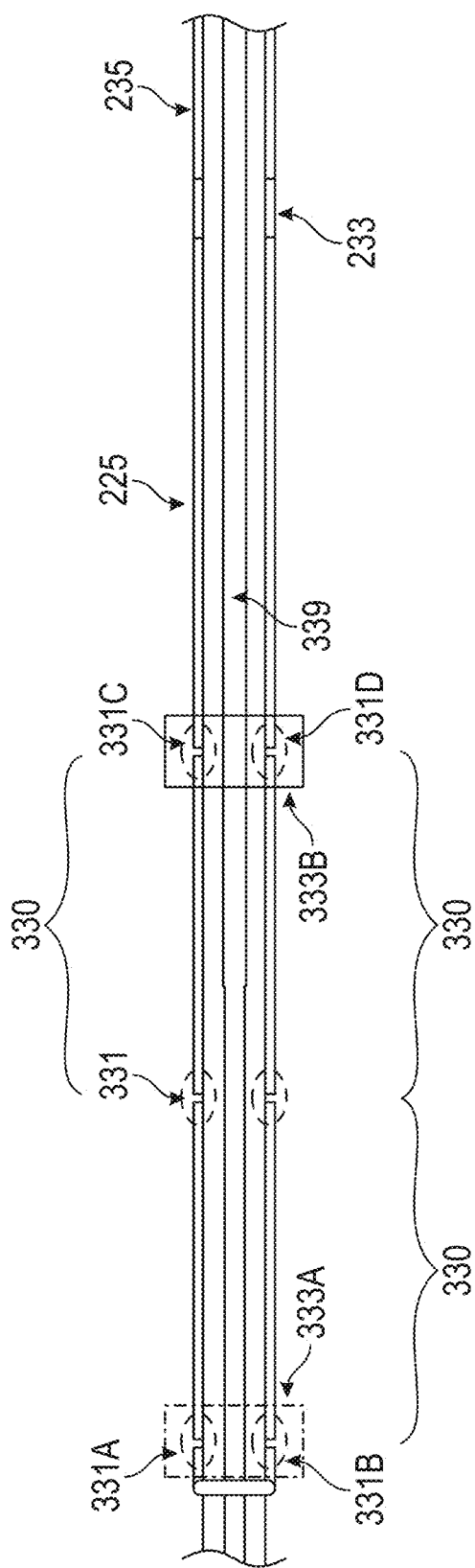
FIG. 7 illustrates a side view of an exemplary catheter comprising six locus emitters, according to some aspects.

Examples of the disclosure include any number of locus emitters including, but not limited to 1, 2, 3, 4, 5, 6, 7, 8, 9, 10, 11, 12, 13, 14, 15, 16, etc. locus emitters. FIG. 7 illustrates a side view of an exemplary catheter comprising six locus emitters, according to some aspects. The six locus emitters 331 may form three emitter regions 333, for example. Configuring the catheter to include a greater number of emitters may allow for more spark gaps, thereby increasing the effectiveness of treatment. Although the figures show an even number of locus emitters 331 and spark gaps, examples of the disclosure may include an odd number of locus emitters 331 and spark gaps (e.g., as shown in FIG. 13). In some examples, the number of locus emitters 331 may be determined based on the length of the balloon 226.

In some examples, the locus emitters of the same emitter region may be positionally aligned (have the same location along the length of the catheter body 339). For example, the six locus emitters 331 shown in FIG. 7 may comprise a first locus emitter 331A, a second locus emitter 331B, a third locus emitter 331C, and a fourth locus emitter 331D. In some examples, the first locus emitter 331A and the second locus emitter 331B may be part of the emitter region 333A and located at the same location along the length of the catheter body 339. The third locus emitter 331C and the fourth locus emitter 331D may be part of the emitter region 333B and located at the same location along the length of the catheter body 339.

In some aspects, at least two of the locus emitters 331 of a plurality of emitter regions may be angular aligned (have the same angle(s) around the circumference of the catheter body 339). For example, the first locus emitter 331A and the second locus emitter 331B of the emitter region 333A may be located at 0 degrees and 180 degrees around the catheter body 339. The third locus emitter 331C and the fourth locus emitter 331C of the emitter region 33B may be located at the same angle(s) around the catheter body 339 as the first locus emitter 331A, e.g., 0 degrees, and the second locus emitter 331B, e.g., 180 degrees around the catheter body 339.

Although the figure illustrates locus emitters 331 at the top of the catheter body 339 being positionally aligned with locus emitters 331 at the bottom of the catheter body 339 (e.g., same emitter region 333) due to having the same location along the length of the catheter body 339 (opposite each other), examples of the disclosure may include emitters 331 that are not positionally aligned. For example, the locus emitters 331 may be staggered relative to each other along the length of the catheter body 339.

Figure 8:
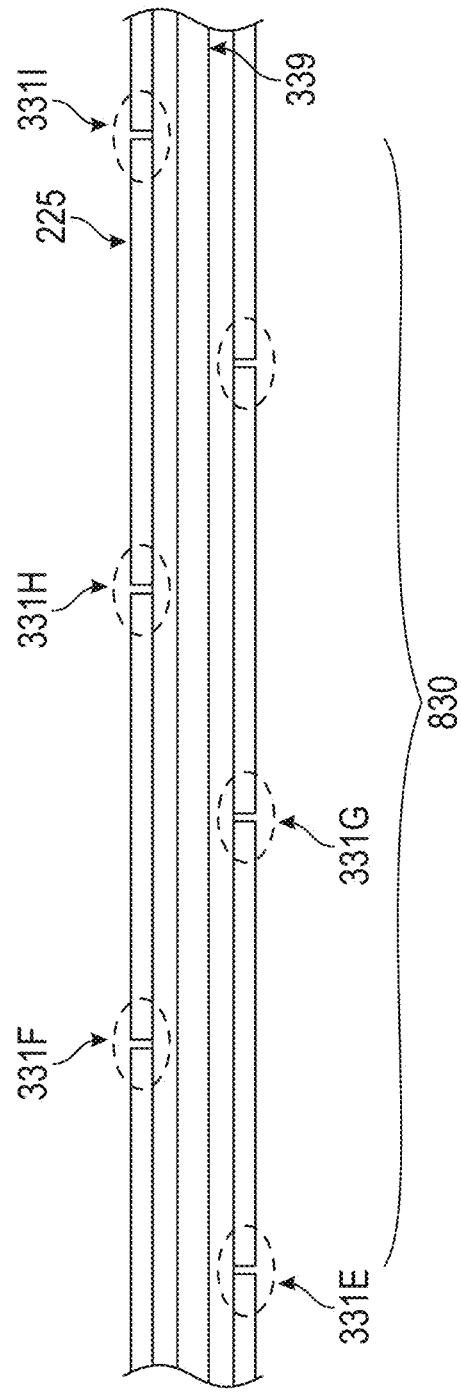
FIG. 8 illustrates a side view of an exemplary catheter comprising staggered locus emitters according to some examples.

FIG. 8 illustrates a side view of an exemplary catheter comprising staggered locus emitters. The catheter 200 may comprise a plurality of locus emitters 331 including a first locus emitter 331E, a second locus emitter 331F, a third locus emitter 331G, a fourth locus emitter 331H, and a fifth locus emitter 331I. The location of the first locus emitter 331A and the location of the second locus emitter 331B along the length of the catheter body 339 may be different (e.g., staggered).

In some instances, a catheter may fail due to shorting near the emitters located at or near the distal end of the catheter. Spacing out the locus emitters 331 decreases the chances of shorting, increasing its longevity. The staggered configuration allows the locus emitters 331 to be spaced out with minimal or no increase in the length needed for the locus emitters 331. For example, as shown in the figure, the first locus emitter 331E may be located at or near the distal end of the catheter body 339, and the fifth locus emitter 331I may be located relatively closer to the proximal end of the catheter body 339. The distance 830 between the first locus emitter 331E (located at or near the distal end) and the fifth locus emitter 331I (located proximally of locus emitter 331E) may be 7.5 mm, for example. In some examples, the spacing between locus emitters 331 located at first position about the circumference of the catheter body 339 may be the same as the spacing between locus emitters 331 located at a second position about the circumference of the catheter body 339. For example, the spacing between the first locus emitter 331E and the third locus emitter 331G (located at 0 degrees)

may be the same as the spacing between the second locus emitter 331F and the fourth locus emitter 331H (located at 180 degrees).

Figure 9:
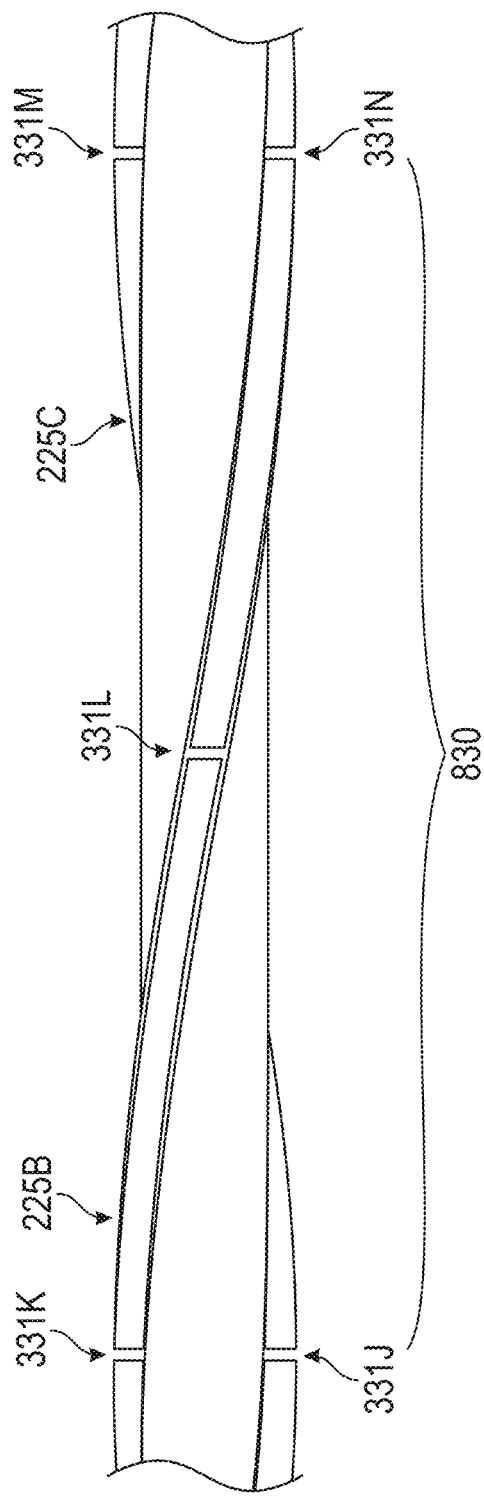
FIG. 9 illustrates emitters arranged in a spiral or helix configuration, rotating about the circumference of the catheter body according to some examples.

In some examples, as shown in FIG. 9, the locus emitters 331 may be arranged in a spiral or helix configuration, rotating about the circumference of the catheter body 339 along the length of the tube. At least some of the locus emitters 331 may have different circumferential locations and/or angles along the length of the lumen 339. For example, the catheter 200 may comprise a plurality of locus emitters 331 including a first locus emitter 331J, a second locus emitter 331K, a third locus emitter 331L, a fourth locus emitter 331M, and a fifth locus emitter 331N. The first locus emitter 331J and the second locus emitter 331K (of a first emitter region) may be located at a first longitudinal location and a first set of angles (e.g., spaced 180 degrees apart from each other about the circumference of catheter body 339 at the same longitudinal location). The locus emitters 331 of a second emitter region (including the third locus emitter 331L) may be located at a different, second location and a second set of (different) angles (e.g., spaced 180 degrees apart from one another about the circumference of catheter body 339 but 90 degrees apart from emitters 331K and 331J). The locus emitters of a third emitter region (including the fourth locus emitter 331M and fifth locus emitter 331N) may be located at a third location and a third set of angles (e.g., spaced 180 degrees apart from one another about the circumference of catheter body 339 and 90 degrees apart from emitter 331L). The third location may be different from the first and second locations. In some aspects, the third set of angles may be different from the second set of angles. In some aspects, the third set of angles (of locus emitters 331M and 331N) may collectively have the same angles as the first set of angles (of locus emitters 331J and 331K), but the locus emitters having the same angles may be formed on different sides of the emitter wire 225. For example, the second locus emitter 331K and the fourth locus emitter 331M may be at 0 degrees, but the second locus emitter 331K may be formed from the top side of the emitter wire 225B, and the fourth locus emitter 331M may be formed from the bottom side of the emitter wire 225C. In this manner, the spiral or helix configuration may improve circumferential uniformity.

Figure 10:
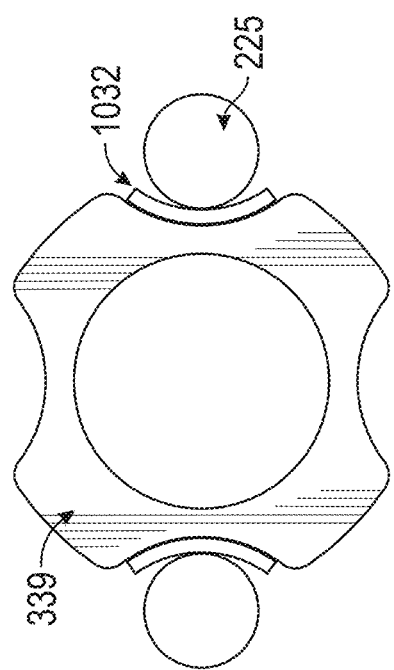
FIG. 10 illustrates a cross-sectional view of an exemplary lumen of a catheter including a protective layer, according to some examples.
Figure 11A:
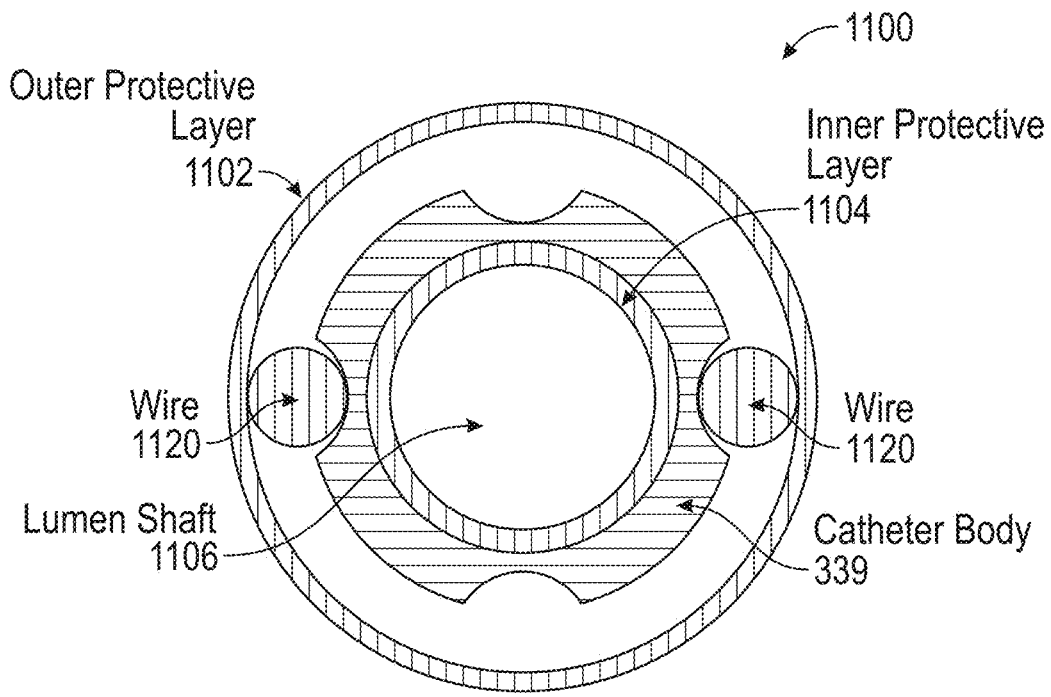
FIG. 11A illustrates a catheter having an outer layer that at least partially surrounds wires and keeps the wires in contact with the catheter body, according to some examples.
Figure 11B:
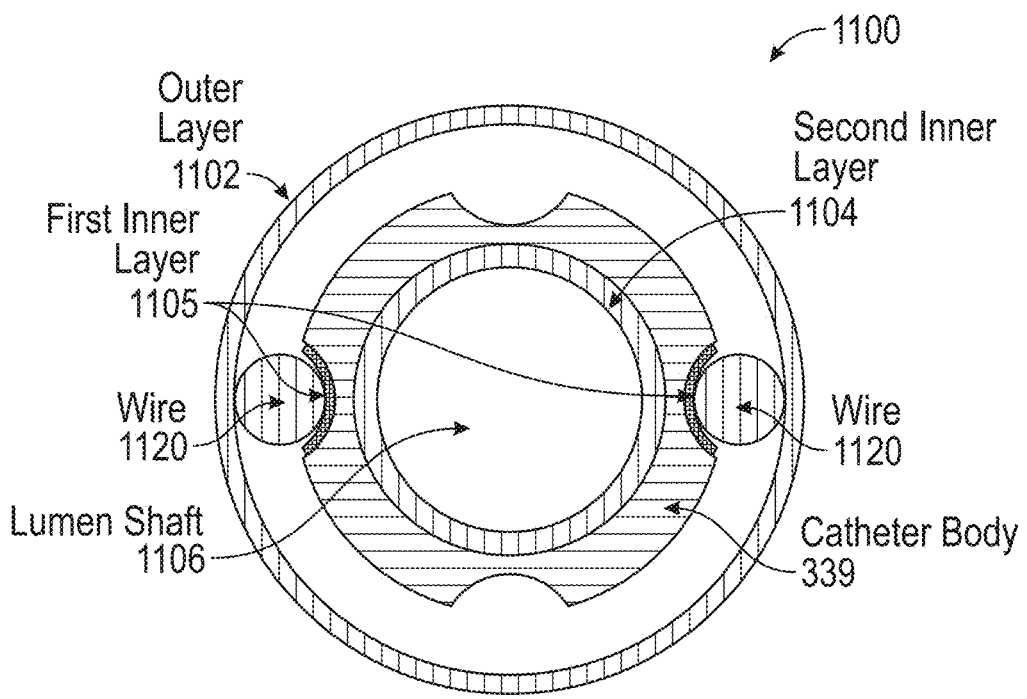
FIG. 11B illustrates a catheter having an inner layer positioned between wires and the catheter body, according to some examples.

In some aspects, the longevity of the catheter may be extended by including a protective layer. FIG. 10 illustrates a cross-sectional view of an exemplary lumen of a catheter including a protective layer, according to some examples. The catheter 200 may include a protective layer 1032 located between the emitter wire 225 and the lumen 339. In some examples, the protective layer may additionally or alternatively (as shown in FIG. 11A) lie within the lumen shaft of catheter body 339 (second inner layer 1104) and/or around the catheter body 339 (outer layer 1102 surrounding at least a portion of the wires and/or first inner layer 1105 positioned between the wires 1120 and catheter body 339 as shown in FIG. 11B). In some aspects, the protective layer 1032 may serve as an additional layer of insulation to prevent or reduce pitting inside the lumen 339 from the heat and pressures associated with shock wave generation. One non-limiting example type of a protective layer is a polymer layer (e.g., a polyimide layer). In some examples, the protective layer may be made of an electrically insulating material. In some examples, the protective layer may be made of a material having a low thermal conductivity. The protective layer 1032 may improve sonic output and longevity. As shown in the figure, the emitter wire 225 may have a circular profile.

FIG. 11A also illustrates a catheter 1100 having an outer layer 1102 that at least partially surrounds the wires 1120 and keeps the wires 1120 in contact with the catheter body 339. The outer layer 1102 may be made of an electrically insulating polymer (e.g., polyether block amide (peba) or nylon). In various embodiments, the outer protective layer 1102 does not surround the spark gaps. In various embodiments, the outer protective layer 1102 surrounds the wires and includes openings (e.g., holes, slits, gaps) to expose the sparks gaps to conductive fluid. In some examples, the inner protective layer 1106 may be formed of the same material as the outer protective layer.

As discussed throughout this disclosure, the disclosed examples may improve sonic output. In some examples, the pressure at the treatment area (e.g., lesion) resulting from the shock waves generated using the locus emitters described herein may be between 25 atm and 75 atm. In some examples, the pressure at the treatment area resulting from the shock waves generated using the locus emitters is at least 20 atm, at least 25 atm, at least 30 atm, at least 35 atm, at least 40 atm, at least 45 atm, at least 50 atm, at least 55 atm, at least 60 atm, at least 65 atm, at least 70 atm, at least 75 atm, at least 80 atm, at least 85 atm, at least 90 atm, at least 95 atm, at least 100 atm. In some examples, the pressure at the treatment area resulting from the shock waves generated using the locus emitters is no more than 100 atm, no more than 95 atm, no more than 85 atm, no more than 75 atm, no more than 65 atm, no more than 60 atm, no more than 55 atm, no more than 50 atm, no more than 45 atm, no more than 40 atm, no more than 35 atm, no more than 30 atm, no more than 25 atm and/or no more than 20 atm.

Figure 12:
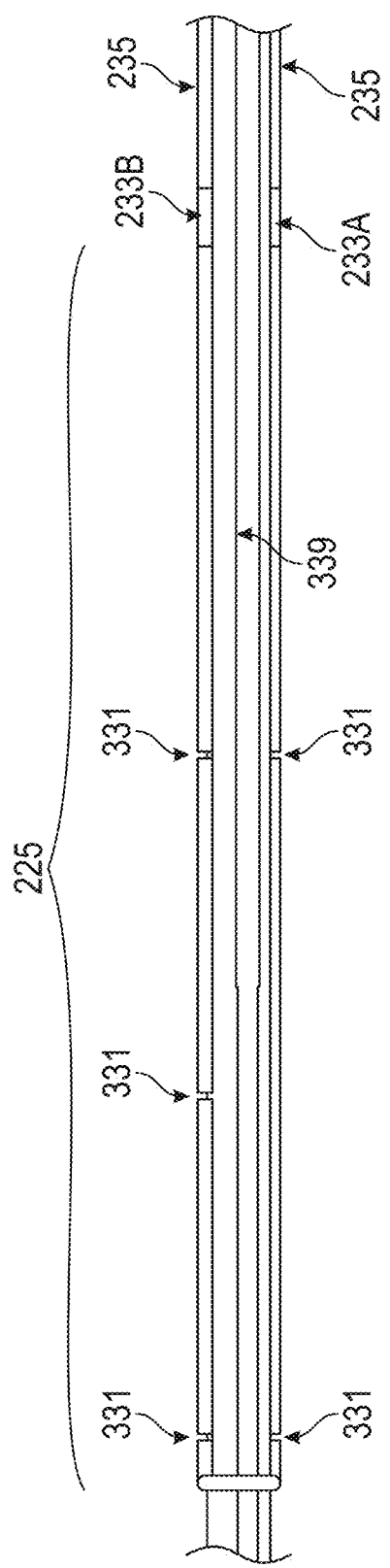
FIG. 12 illustrates a portion of an exemplary catheter that includes a plurality of locus emitters according to some examples.

FIG. 12 illustrates a portion of an exemplary catheter 1200 that includes a plurality of locus emitters. The exemplary catheter 1200 may include any of the features described throughout the disclosure. Accordingly, the locus emitters 331 illustrated in FIG. 12 may include two exposed portions of emitter wire 225 spaced apart from each other by respective spark gaps. While the catheter depicted in FIG. 3 includes four evenly distributed locus emitters, catheter 1200 includes five irregularly distributed locus emitters 331. The positioning of the emitters about the circumference of the catheter body 339 and longitudinally along catheter body 339 may impact the manner of propagation of the emitted shock waves. For instance, the positioning of the locus emitters relative to one another may impact the location at which constructive interference of the shock waves emitted from the respective locus emitters is greatest. An arrangement comprising an odd number of emitter regions could be utilized to bias sonic output toward eccentric calcification.

FIG. 13 illustrates a portion of an exemplary catheter that includes a plurality of locus emitters. As described throughout, in some examples, the locus emitters may include two exposed portions of a first conductive element (e.g., an emitter wire), which may be formed from a different, stiffer, more durable, and/or less conductive material (e.g., molybdenum) than a second conductive element (e.g., a carrier wire) formed of a more conductive, less stiff, and less durable material (e.g., copper). In such examples, the emitter wire and carrier wire may be electrically coupled to each other by one or more electrical joints. In some examples, however, the wiring extending along the length of the catheter from a power source to the locus emitters (and forming the exposed ends at each of the locus emitters) may be formed of the material used for the emitter wire (e.g., the more durable, stiffer, and less conductive material). For instance, the wiring along the length of the catheter body 339 may be formed entirely of molybdenum, tungsten, rhodium, rhenium, tantalum, niobium, or a combination thereof.

Figure 14:
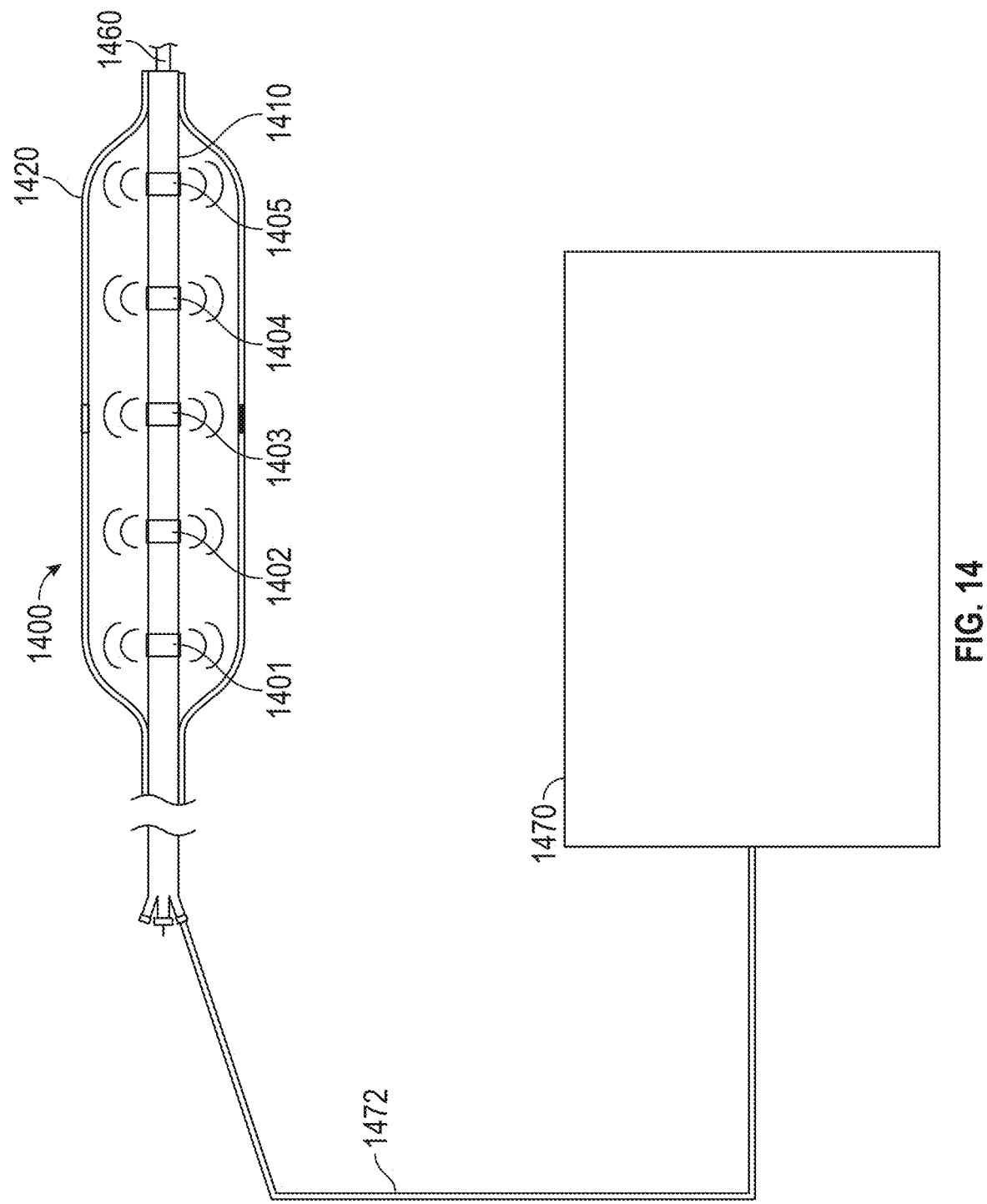
FIG. 14 illustrates an exemplary IVL catheter system according to one or more aspects of the disclosure.

FIG. 14 illustrates an exemplary IVL catheter system according to one or more aspects of the disclosure. The catheter system includes a catheter 1400, a conductive wire comprising an energy guide 1472 for routing energy to the catheter 1400, and a power source 1470. The catheter 1400 includes a catheter body 1410 having a guide wire lumen for guiding the catheter 1400 along a guide wire 1460 to a treatment site. Catheter 1400 also includes an enclosure 1420 that surrounds at least a portion of the catheter body. The catheter 1400 includes shock wave generating regions 1401, 1402, 1403, 1404, and 1405 that are located along the catheter body 1400. In response to delivery of energy from the power source 1470, one or more shock waves are generated from one or more of the shock wave generating regions 1401, 1402, 1403, 1404, and 1405. The catheter 1400 may be configured such that one or more of the shock wave generating regions can generate shock waves independently of one or more of the remaining shock wave generating regions and/or may be configured such that all of the shock wave generating regions simultaneously generate shock waves. Although five shock wave generating regions are shown in FIG. 14, fewer shock wave generating regions (e.g., one, two, three, or four shock wave generating regions) may be included and/or more additional shock wave generating regions may be included, for instance, in shorter or in longer catheters for treating shorter or longer lesions.

Exemplary IVL catheter systems (such as the one shown in FIG. 14) are used for treating lesions in body lumens. In various examples, a lesion could be a calcified region of vasculature, a thrombus or an occlusion in vasculature, arteriosclerotic plaque, or a lesion in some other body lumen, such as a kidney stone in a ureter. In one or more embodiments, each of the one or more of the shock wave generating regions 1401, 1402, 1403, 1404, and 1405 includes an electrode assembly, which includes one or more electrode pairs. As described above, the term "electrode" refers to an electrically conducting element (typically made of metal) that receives electrical current and subsequently releases the electrical current to another electrically conducting element. In the context of the present disclosure, electrodes are often positioned relative to each other, such as in an arrangement of two exposed conductive wire portions separated by a relatively small gap.

In one or more embodiments of the present disclosure, the power source 1470 shown in FIG. 14 includes a high voltage pulse generator. In one or more embodiments, the power source 1470 supplies a high voltage pulse no less than six kilovolts (6 kV). In one or more embodiments, the power source 1470 supplies a high voltage pulse no less than ten kilovolts (10 kV). In one or more embodiments, the power source 1470 supplies a high voltage pulse between three kilovolts (3 kV) and thirty kilovolts (30 kV). In one or more embodiments, the power source 1470 supplies a high voltage pulse between six kilovolts (6 kV) and ten kilovolts (10 kV). In one or embodiments, the power source 1470 is configured to supply a high voltage pulse that is adjustable in intensity. In some examples, the power source 1470 applies an alternating current to the electrodes to induce a change in the polarity of the electrodes.

As explained above, the application of a relatively high voltage pulse (e.g., greater than or equal to 10 kV) may be beneficial for treating certain types of lesions (e.g., lesions associated with aortic valve stenosis) that necessitate a higher sonic output for treatment. In some examples, the high voltage pulses are applied at a voltage of at least at least 1 kV, at least 2 kV, at least 3 kV, at least 4 kV, at least 5 kV, at least 6 kV, at least 7 kV, at least 8 kV, at least 9 kV, at least 10 kV, at least 11 kV, at least 12 kV, at least 13 kV, at least 14 kV, at least 15 kV, at least 16 kV, at least 17 kV, at least 18 kV, at least 19 kV, at least 20 kV, and/or at least 30 kV. The high voltage pulses may be no more than 30 kV, no more than 20 kV, no more than 19 kV, no more than 18 kV, no more than 17 kV, no more than 16 kV, no more than 15 kV, no more than 14 kV, no more than 13 kV, no more than 12 kV, no more than 11 kV, no more than 10 kV, no more than 9 kV, no more than 8 kV, no more than 7 kV, no more than 6 kV, no more than 5 kV, no more than 4 kV, no more than 3 kV, no more than 2 kV, and/or no more than 1 kV.

The voltage pulses may be applied at a rate of a rate of between 1 Hz and 50 Hz, including 1 Hz and 50 Hz. Shock wave energy generator 530 may be configured to deliver the voltage pulses at a rate of a rate of up to 100 Hz, up to 90 Hz, up to 80 Hz, up to 70 Hz, up to 60 Hz, up to 50 Hz, up to 40 Hz, up to 30 Hz, up to 20 Hz, and/or up to 10 Hz. Shock wave energy generator 530 may be configured to deliver the voltage pulses at a rate of at least 10 Hz, at least 20 Hz, at least 30 Hz, at least 40 Hz, at least 50 Hz, at least 60 Hz, at least 70 Hz, at least 80 Hz, at least 90 Hz, and/or at least 100 Hz.

The enclosure 120 shown in FIG. 14, in one or more embodiments, is a balloon (e.g., an angioplasty balloon). The enclosure 120 may be in a collapsed or deflated configuration to provide a lower profile during delivery to the treatment site. During treatment, the enclosure 120 may be inflated to a pressure between two and four atmospheres (2 atm-4 atm) with a liquid fluid (e.g., saline). Energy is then provided to shock wave generating regions 101, 102, 103, 104, and 105 resulting in the generation of one or more shock waves. The enclosure may then be deflated and reinflated to flush out any accumulated gas bubbles before further treatment at that site. The enclosure 120 may alternatively be advanced further to a different lesion (or different section of the same lesion) or withdrawn from the patient.

In some embodiments, the application of high voltage pulses and/or application of a large number of pulses over time to shock wave generating regions 101, 102, 103, 104, and 105 can result in degradation of the electrodes. Degradation of the electrodes may, over time, result in less reliable shock wave generation and/or reduced sonic output. Further deterioration of the electrodes can result in shrapnel during shock wave generation, which can puncture enclosures (e.g., angioplasty balloons) surrounding the electrodes and/or damage tissue within the body. Forming the electrodes from a material that is relatively more resistant to wear can improve electrode durability, thus enhancing the longevity of shock wave generating catheters. Such relatively more durable materials, however, also present several challenges. For instance, such materials may provide significantly lower conductivity (which may impede performance of the generator) and may result in a catheter having reduced navigability due to higher stiffness/hardness of the material (e.g., if used for wiring along the length of a relatively significant portion of the catheter).

Accordingly, such a material may be a counterintuitive choice as an electrode material for the catheters described herein. The challenges presented by these relatively more durable materials, however, may be overcome by using a first material having a relatively lower stiffness and relatively higher conductivity to conduct electrical energy from the power source along the length of the catheter 100, and using a second, relatively more durable, material with a relatively higher stiffness and lower conductivity near the distal end of the catheter to conduct electricity to the one or more shock wave generating regions 101, 102, 103, 104, and 105. In some examples, at least one of the electrodes of at least one shock wave emitter of shock wave generating regions 101, 102, 103, 104, and 105 may be formed of the relatively more durable material, which may result in a shock wave emitter having greater longevity and reliability (relative of emitters with electrodes formed of the first material) for the reasons described above.

Figure 15:
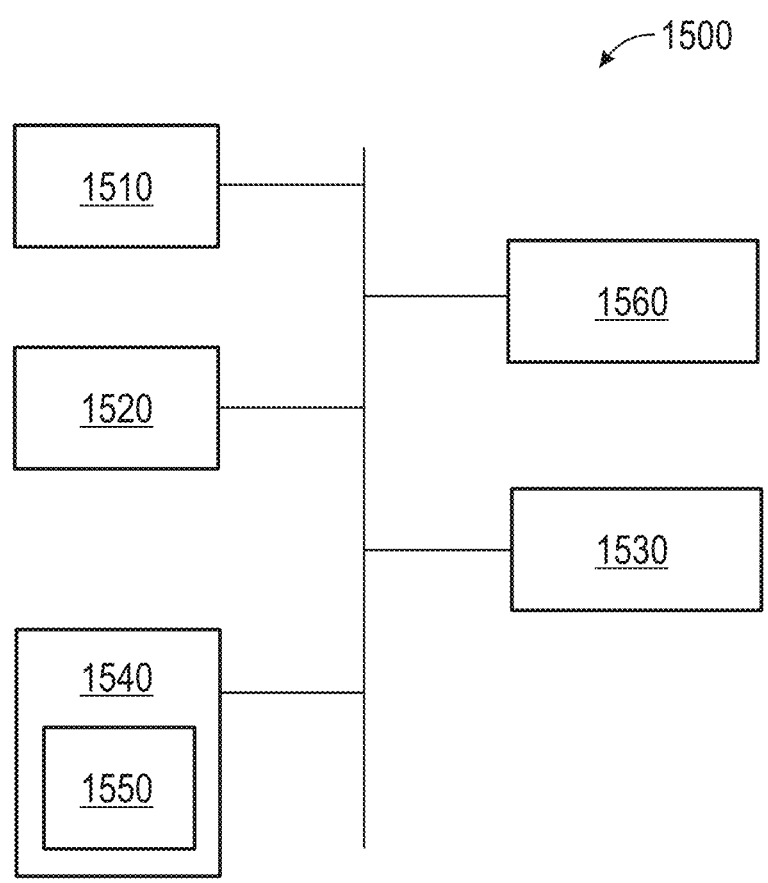
FIG. 15 illustrates an exemplary computing system according to some examples.

FIG. 15 illustrates an exemplary of a computing system 1500, in accordance with some examples of the disclosure. System 1500 can be a client or a server. As shown in FIG. 15, system 1500 can be any suitable type of processor-based system, such as a personal computer, workstation, server, handheld computing device (portable electronic device) such as a phone or tablet, or dedicated device. The system 1500 can include, for example, one or more of input device 1520, output device 1530, one or more processors 1510, storage 1540, and communication device 1560. Input device 1520 and output device 1530 can generally correspond to those described above and can either be connectable or integrated with the computer.

Input device 1520 can be any suitable device that provides input, such as a touch screen, keyboard or keypad, mouse, gesture recognition component of a virtual/augmented reality system, or voice-recognition device. Output device 1530 can be or include any suitable device that provides output, such as a display, touch screen, haptics device, virtual/augmented reality display, or speaker.

Storage 1540 can be any suitable device that provides storage, such as an electrical, magnetic, or optical memory including a RAM, cache, hard drive, removable storage disk, or other non-transitory computer readable medium. Communication device 1560 can include any suitable device capable of transmitting and receiving signals over a network, such as a network interface chip or device. The components of the computing system 1500 can be connected in any suitable manner, such as via a physical bus or wirelessly.

Processor(s) 1510 can be any suitable processor or combination of processors, including any of, or any combination of, a central processing unit (CPU), graphics processing unit (GPU), field programmable gate array (FPGA), programmable system on chip (PSOC), and application-specific integrated circuit (ASIC). Software 1550, which can be stored in storage 1540 and executed by one or more processors 1510, can include, for example, the programming that embodies the functionality or portions of the functionality of the present disclosure (e.g., as embodied in the devices as described above)

Software 1550 can also be stored and/or transported within any non-transitory computer-readable storage medium for use by or in connection with an instruction execution system, apparatus, or device, such as those described above, that can fetch instructions associated with the software from the instruction execution system, apparatus, or device and execute the instructions. In the context of this disclosure, a computer-readable storage medium can be any medium, such as storage 1540, that can contain or store programming for use by or in connection with an instruction execution system, apparatus, or device.

Software 1550 can also be propagated within any transport medium for use by or in connection with an instruction execution system, apparatus, or device, such as those described above, that can fetch instructions associated with the software from the instruction execution system, apparatus, or device and execute the instructions. In the context of this disclosure, a transport medium can be any medium that can communicate, propagate, or transport programming for use by or in connection with an instruction execution system, apparatus, or device. The transport computer readable medium can include, but is not limited to, an electronic, magnetic, optical, electromagnetic, or infrared wired or wireless propagation medium.

System 1500 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, T1 or T3 lines, cable networks, DSL, or telephone lines.

System 1500 can implement any operating system suitable for operating on the network. Software 1550 can be written in any suitable programming language, such as C, C++, Java, or Python. In various embodiments, application software embodying the functionality of the present disclosure can be deployed in different configurations, such as in a client/server arrangement or through a Web browser as a Web-based application or Web service, for example.

The elements and features of the exemplary electrode assemblies and catheters discussed above may be rearranged, recombined, and modified, without departing from the present invention. Furthermore, numerical designators such as "first," "second," "third," "fourth," etc. are merely descriptive and do not indicate a relative order, location, or identity of elements or features described by the designators. For instance, a "first" shock wave may be immediately succeeded by a "third" shock wave, which is then succeeded by a "second" shock wave. As another example, a "third" emitter may be used to generate a "first" shock wave and vice versa. Accordingly, numerical designators of various elements and features are not intended to limit the disclosure and may be modified and interchanged without departing from the subject invention.

As provided herein, it should be appreciated that any disclosure of a numerical range describing dimensions or measurements such as thicknesses, length, weight, time, frequency, temperature, voltage, current, angle, etc. is inclusive of any numerical increment or gradient within the ranges set forth relative to the given dimension or measurement.

It should be noted that the elements and features of the example catheters illustrated throughout this specification and drawings may be rearranged, recombined, and modified without departing from the present invention. For instance, while this specification and drawings describe and illustrate catheters having several example balloon designs, the present disclosure is intended to include catheters having a variety of balloon configurations. The number, placement, and spacing of the electrode pairs of the shock wave generators can be modified without departing from the subject invention. Further, the number, placement, and spacing of balloons of catheters can be modified without departing from the subject invention.

It should be understood that the foregoing is only illustrative of the principles of the invention, and that various modifications, alterations and combinations can be made by those skilled in the art without departing from the scope and spirit of the invention. Any of the variations of the various catheters disclosed herein can include features described by any other catheters or combination of catheters herein.

Furthermore, any of the methods can be used with any of the catheters disclosed. Accordingly, it is not intended that the invention be limited, except as by the appended claims.

The invention claimed is:

1. A shock wave catheter system comprising:
   a catheter body comprising a lumen;
   an emitter wire configured to generate shock waves, wherein one or more gaps are formed between two or more discontinuous portions of the emitter wire along a length of the catheter body, each of the one or more gaps forming a locus emitter;
   a carrier wire configured to conduct electricity to the emitter wire; and
   one or more electrical joints configured to electrically couple and join the emitter wire and the carrier wire.

2. The shock wave catheter system of claim 1, further comprising:
   an enclosure configured to be filled or inflated with a fluid, wherein the emitter wire is located at least partially within the enclosure.

3. The shock wave catheter system of claim 1, wherein the emitter wire is located along a distal end of the shock wave catheter system.

4. The shock wave catheter system of claim 1, wherein the emitter wire comprises molybdenum, tungsten, rhodium, rhenium, tantalum, niobium, or a combination thereof.

5. The shock wave catheter system of claim 1, wherein a diameter of the emitter wire comprises between 0.002" and 0.010".

6. The shock wave catheter system of claim 1, wherein the emitter wire is a flat wire or has a semi-circle profile.

7. The shock wave catheter system of claim 1, wherein the carrier wire is located along a proximal end of the shock wave catheter system.

8. The shock wave catheter system of claim 1, wherein the carrier wire comprises copper.

9. The shock wave catheter system of claim 1, wherein a diameter of the carrier wire is larger than a diameter of the emitter wire.

10. The shock wave catheter system of claim 1, wherein the one or more electrical joints are located near a distal end of the catheter body and proximally of the emitter wire.

11. The shock wave catheter system of claim 1, wherein the one or more electrical joints are formed using tack welding, laser welding, crimping, wrapping stripped wires around each other, soldering, swagging, a conductive adhesive, ferrule pins, or a combination thereof.

12. The shock wave catheter system of claim 1, wherein a number of the one or more locus emitters comprises between 1 and 16 locus emitters, including 1 and 16.

13. The shock wave catheter system of claim 1, further comprising:
   a wire wrap or marker band located at a distal end of the shock wave catheter system.

14. The shock wave catheter system of claim 1, wherein the one or more locus emitters form emitter regions, wherein locus emitters of the same emitter region are positionally aligned along a length of the catheter body.

15. The shock wave catheter system of claim 1, wherein the one or more locus emitters comprise at least two locus emitters that are angularly aligned along a circumference of the catheter body.

16. The shock wave catheter system of claim 1, wherein the at least two locus emitters that are angularly aligned along a circumference of the lumen are spaced apart 180 degrees about the circumference of the catheter body.

17. The shock wave catheter system of claim 1, further comprising:
   a protective layer located between the catheter body and the emitter wire.

18. The shock wave catheter system of claim 1, wherein the emitter wire comprises a first material, and the carrier wire comprises a second material different from the first material.

19. The shock wave catheter system of claim 18, wherein the first material comprises a high melting point, a higher electrical resistivity, a lower conductivity, a higher stiffness, a higher density, or any combination thereof, relative to the second material.

20. The shock wave catheter system of claim 1, wherein a diameter of the emitter wire is between 0.08 mm and 0.23 mm.

21. The shock wave catheter system of claim 1, wherein the carrier wire is located proximal of the emitter wire.

22. The shock wave catheter system of claim 1, comprising a protective layer positioned to at least partially enclose one or both of the emitter wire and the carrier wire, and wherein the protective layer secures one or both of the emitter wire and the carrier wire to the catheter body.

* * * * *